US009181085B2

(12) United States Patent
Yoon et al.

(10) Patent No.: US 9,181,085 B2
(45) Date of Patent: Nov. 10, 2015

(54) METHOD FOR MANUFACTURING PRINTED PRODUCT BY ALIGNING AND PRINTING FINE PARTICLES

(75) Inventors: Kyung Byung Yoon, Seoul (KR); Nguyen Khanh Nguyen, Seoul (KR); Cao Thanh Tung Pham, Seoul (KR)

(73) Assignee: INDUSTRY-UNIVERSITY COOPERATION FOUNDATION SOGANG UNIVERISTY, Seoul (KR)

( * ) Notice: Subject to any disclaimer, the term of this patent is extended or adjusted under 35 U.S.C. 154(b) by 938 days.

(21) Appl. No.: 13/263,696
(22) PCT Filed: Apr. 9, 2010
(86) PCT No.: PCT/KR2010/002180
§ 371 (c)(1),
(2), (4) Date: Dec. 19, 2011
(87) PCT Pub. No.: WO2010/117228
PCT Pub. Date: Oct. 14, 2010

(65) Prior Publication Data
US 2012/0114920 A1 May 10, 2012

(30) Foreign Application Priority Data

Apr. 9, 2009 (KR) .................. 10-2009-0030647

(51) Int. Cl.
*B81C 1/00* (2006.01)
*B82Y 10/00* (2011.01)
(Continued)

(52) U.S. Cl.
CPC ............. *B81C 1/00373* (2013.01); *B82Y 10/00* (2013.01); *B82Y 30/00* (2013.01); *B82Y 40/00* (2013.01);
(Continued)

(58) Field of Classification Search
CPC ........ B82Y 10/00; B82Y 30/00; B82Y 40/00; B81C 1/00373; G03F 7/0002
See application file for complete search history.

(56) References Cited

U.S. PATENT DOCUMENTS 3,389,655 A    6/1968   Lorenz et al.
4,491,628 A    1/1985   Ito et al.
(Continued)

FOREIGN PATENT DOCUMENTS

JP    2002-45777 A    2/2002
JP    2003-100211 A   4/2003
(Continued)

OTHER PUBLICATIONS

Lee et al Chem.Mater. 2007,19,5553-5556.*
(Continued)

*Primary Examiner* — Xiao Zhao
(74) *Attorney, Agent, or Firm* — Seed IP Law Group PLLC

(57) ABSTRACT

Provided is method of preparing a printed matter with a printed array of particles, the method including: (a) preparing a template, a surface of which has depressions or projections capable of fixing the positions and/or orientations of one or more particles; (b) placing the particles on the template and applying a physical pressure to the particles so that a portion or the whole of each particle is inserted in each of pores defined by the depressions or the projections to form a particle array; and (c) contacting the template having thereon the particle array to a printing substrate so that the particle array is transferred to the printing substrate. Provided is also a method of preparing a printed matter with a printed array of particles, the method including: (a) preparing a template, at least a surface portion of which has adhesive property; (b) placing particles on the template and applying a physical pressure to the particles so that the particles are immobilized on adhesive surface portions of the substrate to form a particle array; and (c) contacting the template having thereon the particle array to a printing substrate so that the particle array is transferred to the printing substrate.

17 Claims, 16 Drawing Sheets

(51) Int. Cl.
*B82Y 30/00* (2011.01)
*B82Y 40/00* (2011.01)
*C30B 5/00* (2006.01)
*C30B 29/60* (2006.01)
*G03F 7/00* (2006.01)

(52) U.S. Cl.
CPC . *C30B 5/00* (2013.01); *C30B 29/60* (2013.01); *G03F 7/0002* (2013.01); *Y10T 156/10* (2015.01); *Y10T 428/24851* (2015.01); *Y10T 428/24876* (2015.01); *Y10T 428/24893* (2015.01); *Y10T 428/25* (2015.01)

(56) References Cited

U.S. PATENT DOCUMENTS

| | | | |
|---|---|---|---|
| 4,794,020 | A | 12/1988 | Lussi et al. |
| 5,206,317 | A | 4/1993 | Hertler et al. |
| 5,468,589 | A | 11/1995 | Urano et al. |
| 5,492,793 | A | 2/1996 | Breyta et al. |
| 5,679,495 | A | 10/1997 | Yamachika et al. |
| 5,691,396 | A | 11/1997 | Takemura et al. |
| 5,731,126 | A | 3/1998 | Takemura et al. |
| 5,747,622 | A | 5/1998 | Maeda et al. |
| 5,882,844 | A | 3/1999 | Tsuchiya et al. |
| 5,985,524 | A | 11/1999 | Allen et al. |
| 6,028,154 | A | 2/2000 | Schaedeli et al. |
| 6,042,989 | A | 3/2000 | Schaedeli et al. |
| 6,146,793 | A | 11/2000 | Schaedeli et al. |
| 6,165,682 | A | 12/2000 | Foster et al. |
| 6,329,125 | B2 | 12/2001 | Takechi et al. |
| 6,340,734 | B1 | 1/2002 | Lin et al. |
| 6,379,861 | B1 | 4/2002 | Tefonas, III et al. |
| 6,487,002 | B1 * | 11/2002 | Biegelsen ............... 359/296 |
| 6,531,260 | B2 | 3/2003 | Iwasawa et al. |
| 6,590,010 | B2 | 7/2003 | Kato et al. |
| 7,520,951 | B1 | 4/2009 | Wolf et al. |
| 7,776,196 | B2 | 8/2010 | Fujimoto et al. |
| 2001/0008169 | A1 * | 7/2001 | Connell et al. ............ 156/298 |
| 2004/0053009 | A1 | 3/2004 | Ozin et al. |
| 2005/0196606 | A1 | 9/2005 | Ihara et al. |
| 2008/0160190 | A1 | 7/2008 | Takeuchi et al. |
| 2009/0053129 | A1 | 2/2009 | Black et al. |
| 2009/0246122 | A1 | 10/2009 | Yoon et al. |

FOREIGN PATENT DOCUMENTS

| | | |
|---|---|---|
| JP | 2004-269922 A | 9/2004 |
| JP | 2005-538233 | 12/2005 |
| JP | 2006-30279 A | 2/2006 |
| JP | 2007-283161 A | 11/2007 |
| JP | 2008080461 A | 4/2008 |
| KR | 100789661 B1 | 12/2007 |
| WO | 2008/082269 A1 | 7/2008 |

OTHER PUBLICATIONS

Japanese Office Action issued in corresponding Japanese Patent Application No. 2012-504621 on Jun. 3, 2014; 2 pages (without English Translation).
Japanese Office Action issued in JP patent Appln. No. 2012-504621 on Aug. 13, 2013, 5 pages (without English Translation).
T. Kraus et al., "Closing the Gap Between Self-Assembly and Microsystems Using Self-Assembly, Transfer, and Integration of Particles," Advanced Materials, vol. 17, No. 20, XP055063438, Oct. 17, 2005, pp. 2438-2442.
Byoung H. Lee et al., "Patterning a Two-Dimensional Colloidal Crystal by Water-Mediated Particle Transfer Printing," Chemistry of Materials, vol. 19, No. 23, XP055064196, Nov. 1, 2007, pp. 5553-5556.
T. Kraus et al., "Nanoparticle Printing With Single-Particle Resolution," Nature Nanotechnology, vol. 2, No. 9, XP005063629, Sep. 1, 2007, pp. 570-576.
Hong Kyoon Choi et al., "Fabrication of Ordered Nanostructured Arrays Using Poly(dimethylsiloxane) Replica Molds Based on Three-Dimensional Colloidal Crystals," Advanced Functional Materials, vol. 19, No. 10, XP055063510, Feb. 19, 2009, pp. 1594-1600.
M. H. Kim et al., "Fabrication and Structural Analysis of Binary Colloidal crystals with Two-Dimensional Superlattices," Advanced Materials, vol. 17, No. 20, XP055063624, Oct. 17, 2005, pp. 2501-2505.
Supplementary European Search Report issued in EP Patent Appln. No. 10761889, dated May 27, 2013, 7 pages.
Garcia-Santamaria et al., "Nanorobotic Manipulation of Microspheres for On-Chip Diamond Architectures," Advanced Materials (2002), vol. 14, No. 16, pp. 1144-1147.
Hoogenboom et al., "Template-Induced Growth of Close-Packed and Non-Close-Packed Colloidal Crystals during Solvent Evaporation," Nano Letters (2004), vol. 4, No. 2, pp. 205-208.
Lopez, "Materials Aspects of Photonic Crystals," Advanced Materials (2003), vol. 15, No. 20, pp. 1679-1704.
Norris et al., "Chemical Approaches to Three-Dimensional Semiconductor Photonic Crystals," Advanced Materials (2001), vol. 13, No. 6, pp. 371-376.
Pileni, "Nanocrystal Self-Assemblies: Fabrication and Collective Properties," Journal of Physical Chemistry B (2001), vol. 105, pp. 3358-3371.
Shipway et al., "Nanoparticle Arrays on Surfaces for Electronic, Optical, and Sensor Applications," ChemPhysChem (2000), vol. 1, No. 1, pp. 19-52.
Stöber et al., "Controlled Growth of Monodisperse Silica Spheres in the Micron Size Range," Journal of Colloid and Interface Science (1968), vol. 26, pp. 62-69.
Van Blaaderen et al., "Template-Directed Colloidal Cystallization," Nature (1997), vol. 385, pp. 321-324.
Velev et al., "Colloidal Crystals as Templates for Porous Materials," Current Opinion in Colloid & Interface Science (2000), vol. 5, pp. 56-63.
Wang, "Structural Analysis of Self-Assembling Nanocrystal Superlattices," Advanced Materials (1998), vol. 10, No. 1, pp. 13-30.
Wong et al., "Colloidal Crystal Films: Advances in Universality and Perfection," Journal of the American Chemical Society (2003), vol. 125, No. 50, pp. 15589-15598.
Xia et al., "Monodispersed Colloidal Spheres: Old Materials with New Applications," Advanced Materials (2000), vol. 12, No. 10, pp. 693-713.
Yin et al., "Template-Assisted Self-Assembly: A Practical Route to Complex Aggregates of Monodispersed Colloids with Well-Defined Sizes, Shapes, and Structures," Journal of the American Chemical Society (2001), vol. 123, No. 36, pp. 8718-8729.
Japanese Office Action, dated Feb. 26, 2013, for corresponding JP Application No. 2012-504622, 3 pages.
Japanese Office Action, dated Feb. 18, 2014, for corresponding JP Application No. 2012-504622, 3 pages.
Supplementary European Search Report, dated May 27, 2013, for corresponding EP Application No. 10761890, 6 pages.

* cited by examiner

FIG. 13
close packing 700 nm
(square net)　　　　　(hexagonal net)
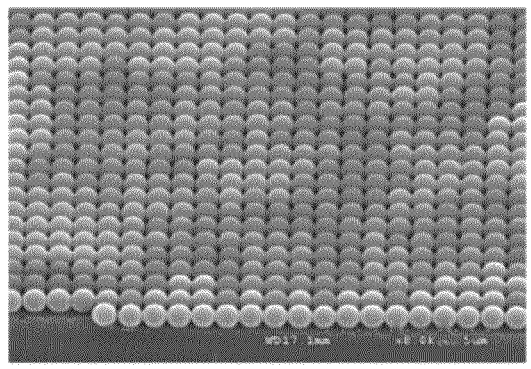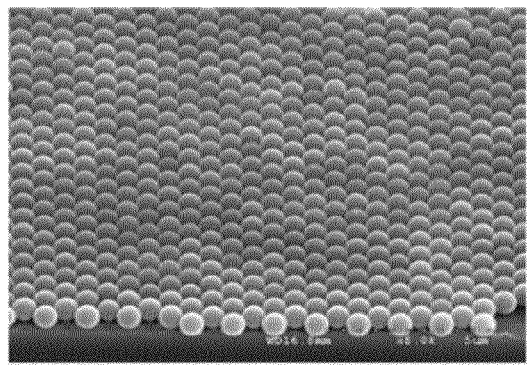
FIG. 14
nonclose packing 600 nm
(square net)　　　　　(hexagonal net)
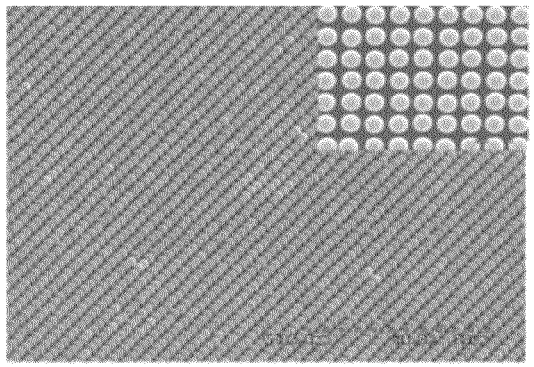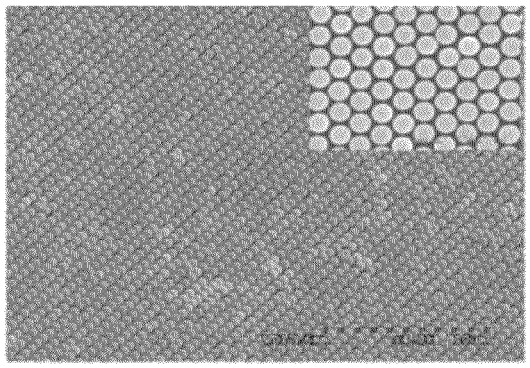

(a)　　　　　　　　　　(b)

(c)　　　　　　　　　　(d)

FIG. 19
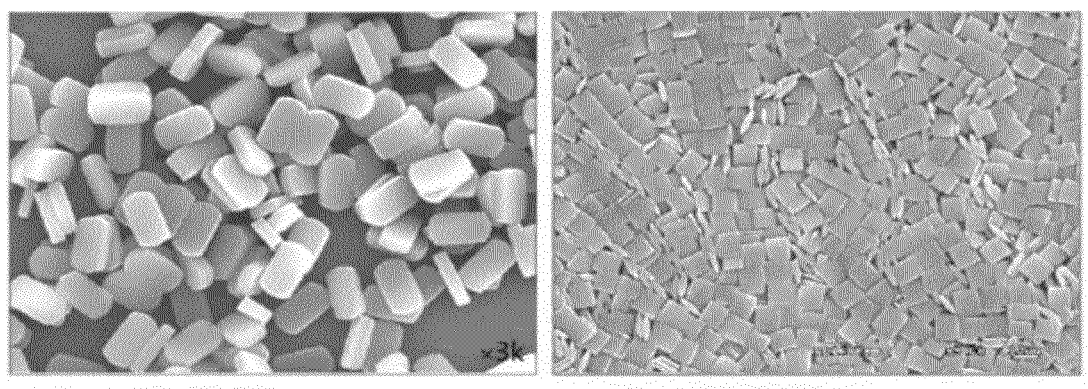
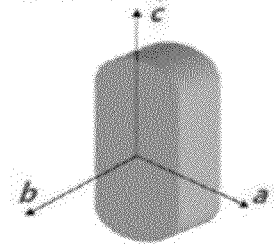
Anisotropic, Coffin shape Silicalite-1 crystal
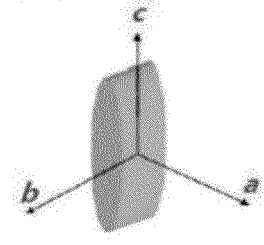
Anisotropic, Leaf shape Silicalite-1 crystal FIG. 21
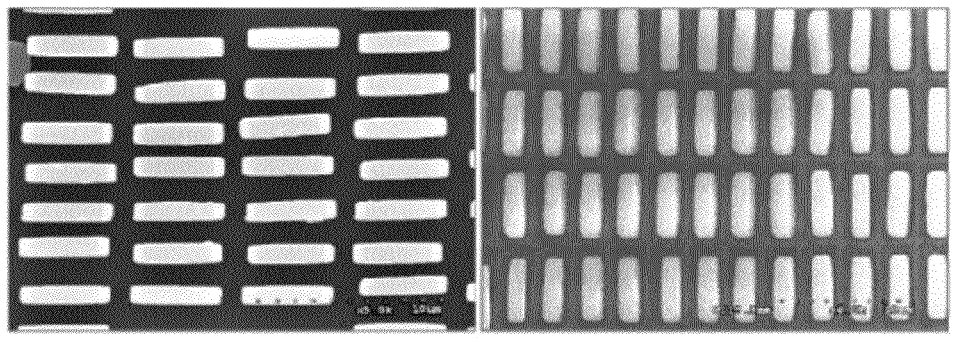
FIG. 22
(a) Transferred Line array, After calcination
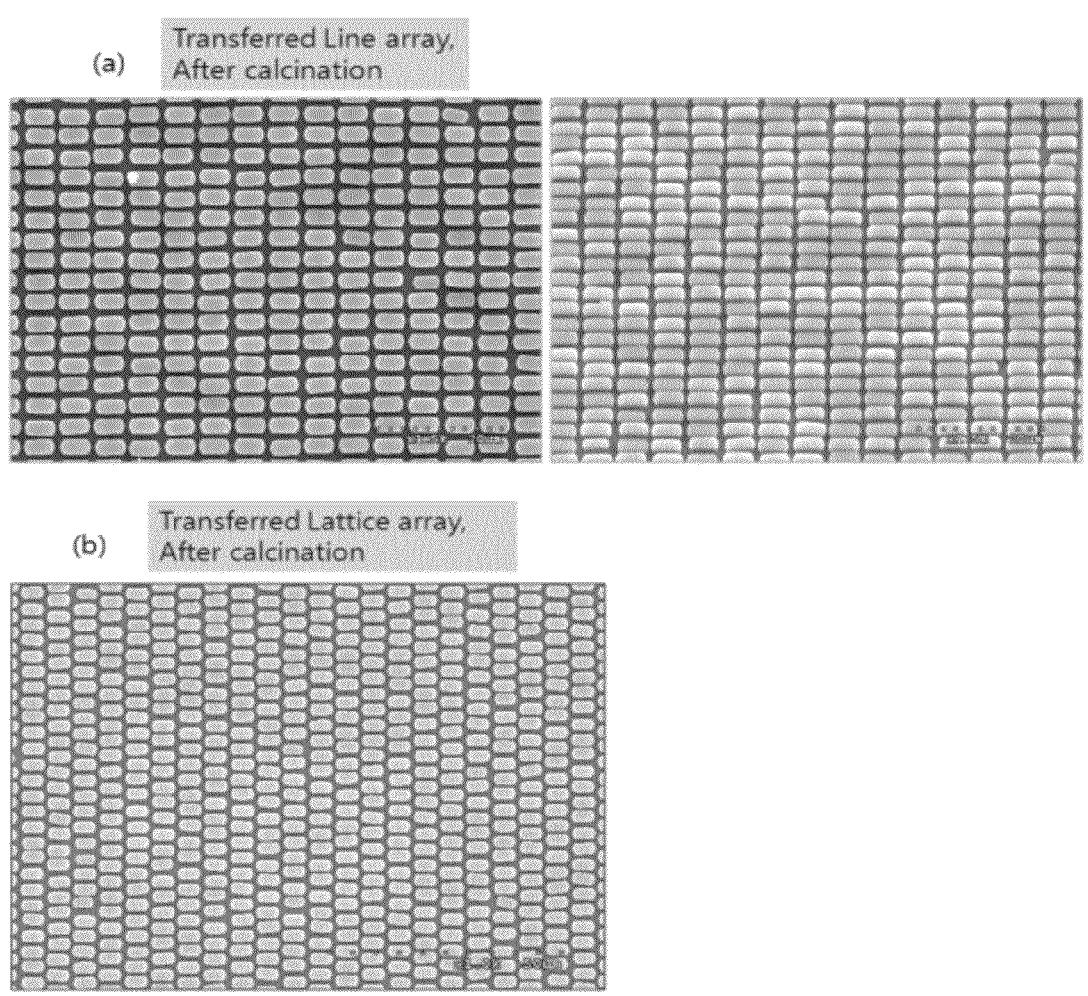
(b) Transferred Lattice array, After calcination
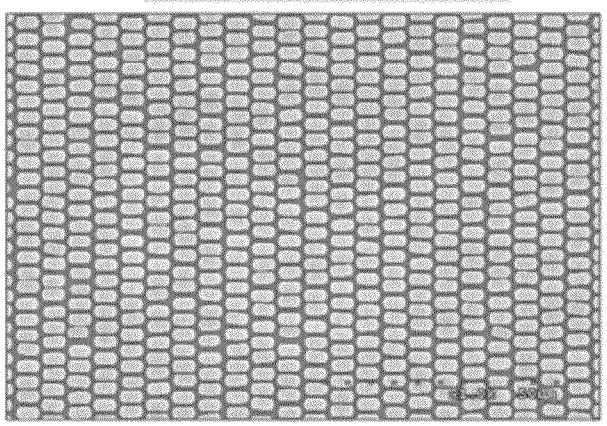

METHOD FOR MANUFACTURING PRINTED PRODUCT BY ALIGNING AND PRINTING FINE PARTICLES

RELATED APPLICATIONS

This application is a 35 U.S.C. §371 National Phase of International Application No. PCT/KR2010/002180 filed on Apr. 9, 2010, which claims priority to Korean Application No. 10-2009-0030647 filed on Apr. 9, 2009, the disclosure of which is herein incorporated by reference in its entirety.

FIELD OF THE INVENTION

The present invention relates to a method of preparing a printed matter wherein particles such as nanoparticles are organized in a one- (1D), two- (2D) or three- (3D) dimensional, monolayer or multilayer array.

DESCRIPTION OF THE RELATED ART

The organization of particles with sizes ranging from several nanometers to several hundreds of micrometers and various properties and/or shapes into 1D, 2D and 3D arrays on substrates has been diversely applied in: 1) memory devices, 2) linear and non-linear optical devices, 3) optoelectronic devices, 4) 1D, 2D and 3D photonic crystals, 5) templates for 3D photonic crystals, 6) optical waveguides, 7) grating, 8) photo masks and deposition masks, 9) sensors (chemical, biochemical or medical sensors for molecular detection of antigen-antibody, DNA-DNA, or protein-protein interactions, pH sensors, solvent sensors), 10) light-emitting or electroluminescent illumination devices, 11) dye-sensitized solar cells, thin film solar cells, etc., 12) 1D, 2D, or 3D photonic crystal lasers, 13) decorative or cosmetic color plates, 14) substrates for lap-on-a-chip application, 15) highly hydrophobic or hydrophilic surfaces, 16) porous membranes, 17) mesoporous template materials, 18) membranes used to produce liquid fuels, such as methanol, from carbon dioxide and water using solar light, etc.

A printing technique for patterning quantum dots made of a semiconductor compound is an important part of optical devices that can adjust an emission wavelength according to the size of quantum dots and exhibits excellent quantum efficiency; next-generation recording media; and single electron transistors and single electron memories which are next-generation semiconductor devices employing a Coulomb blockade effect of electric charges stored in quantum dots. A printing technique for nano-sized metal particles such as gold (Au), silver (Ag), and iron (Fe) also has higher applicability in the field of information recording or memory devices.

Thus, researches for methods of printing particles on substrates have been actively performed. However, there are many problems for mass-production due to difficulty in process precision control and high manufacture costs.

As conventional particle printing methods, there is known a printing method including: preparing a quantum dot dispersion solution including surface-charged quantum dots; modifying a surface of a substrate so that the substrate and the quantum dots are oppositely charged; and coating the quantum dot dispersion solution on the modified substrate. Here, a polymer can be used as a surface treatment material for modifying the quantum dots. This method has problems in that quantum dots are not sized to nano-scale, or a monolayer array on a substrate has low uniformity due to surface voids.

There is also known a Langmuir-Blodgett (LB) method for adsorbing particles on a surface of a substrate by placing the substrate in a particle solution and removing the substrate from the particle solution. Although this method can print a monolayer array on a substrate, printing into desired patterns/shapes is difficult, and undesired particle defect or void formation in a particle array frequently occurs. Moreover, this method is a wet printing process of dispersing particles in a solution, and thus, solvent drying is inevitably required, thereby making a printing process complicated.

In addition, in case of printing particles using a wet process, particles dispersed in a solvent move randomly, and after solvent removal, various particle assemblies are found in specific environmental conditions, thereby making it difficult to print particles on a substrate in desired positions, orientations and/or patterns.

PRIOR ART

Patent Document

Korean Patent No. 789661

DISCLOSURE OF THE INVENTION

Object of the Invention

The present invention has been made in view of the above problems. Thus, the present invention provides a simple method of preparing a printed matter wherein particles are printed in a high density and desired pattern.

Technical Goal of the Invention

The present invention provides a method of preparing a printed matter with a printed array of particles, the method including: (a) preparing a template, a surface of which has depressions or projections capable of fixing the positions and/or orientations of one or more particles; (b) placing particles on the template and applying a physical pressure to the particles so that a portion or the whole of each particle is inserted in each of pores defined by the depressions or the projections to form a particle array; and (c) contacting the template having thereon the particle array to a printing substrate so that the particle array is transferred to the printing substrate (hereinafter, referred to simply as "first method" for brevity of explanation).

The present invention also provides a method of preparing a printed matter with a printed array of particles, the method including: (a) preparing a template, at least a surface portion of which has adhesive property; (b) placing particles on the template and applying a physical pressure to the particles so that the particles are immobilized on adhesive surface portions of the template to form a particle array; and (c) contacting the template having thereon the particle array to a printing substrate so that the particle array is transferred to the printing substrate (hereinafter, referred to simply as "second method" for brevity of explanation).

The present invention also provides a printed matter including a printed array of particles on a substrate, manufactured by the above-described first or second method.

DETAILED DISCLOSURE OF THE INVENTION

Hereinafter, the present invention will be described in detail.

The present inventors have experimentally found that when particles are placed on a template having depressions (e.g., nanowells) or projections (e.g., pillars) capable of fixing the position(s) and/or orientation(s) of one or more particles and a physical pressure such as rubbing is applied thereto, a portion or the whole of each particle can be inserted into each of pores defined by the depressions or projections, and thus, when the depressions and/or the projections are patterned in a predetermined fashion, perfect, large-scale (>cm$^2$), 1D and/or 2D particle arrays can be rapidly formed in an arrangement manner corresponding to the patterns, regardless of the sizes and/or shapes of the particles.

The present inventors have also found that when particles (e.g., silica beads), which have curved surfaces as well as flat facets, are placed on a template, at least a surface portion of which has an adhesive property (e.g., a glass plate coated with polyethyleneimine), and a physical pressure such as rubbing is applied thereto, the particles can be organized as hexagonal close-packed monolayer arrays on adhesive portions of the substrate.

Based on such findings, a technical feature of the present invention resides in that particles are arranged on a template by a physical pressure such as rubbing, thus enabling the rapid formation of large-scale (cm$^2$), 1D and/or 2D, perfect particle array on the template, unlike conventional particle array methods requiring the self-assembly of particles in solvents. Therefore, the inventive methods do not require the precise control of temperature and humidity necessary for the self-assembly of particles in solvents.

Also, particles can be rapidly moved in a desired direction on a template, and thus, the movement of the particles on the template is not affected by surface characteristics (e.g., hydrophobicity, charge, roughness). Furthermore, conventional methods employing particles dispersed in solvents have problems in that the capillary action of solvents leads to poor insertion of particles into pores, thus resulting in coexistence of pores filled and non-filled with particles. In view of the problems, in the present invention, particles are inserted in pores by a physical pressure, thus enabling the insertion of particles in all the pores.

Another feature of the present invention resides in that depressions or projections of a template form a predetermined pattern or shape (FIG. 9) or adhesive surface portions of a template form a predetermined pattern or shape (FIG. 5), and thus, particles immobilized on the template form a pattern or shape corresponding to the pattern or shape of the depressions, projections or adhesive portions, and finally, the particle pattern or shape formed on the template is transferred to a printing substrate.

According to the present invention, it is possible to repeatedly manufacture printed matters using a template with depressions or projections forming a predetermined pattern or shape or a template with adhesive portions forming a predetermined pattern or shape.

In the present invention, a pattern or shape formed by a particle array is intended to comprehend a pattern or shape formed by a plurality of particles, and even more, a pattern or shape formed by adjusting the dimensions and/or orientations of particles.

Hereinafter, steps (a) and (b) of the first and second methods of the present invention will be described with reference to FIGS. 1 and 2.

<Preparation of Template: Step (a)>

A template as used herein is a template having depressions or projections capable of fixing the positions and/or orientations of one or more particles or a template having adhesive surface portions.

The template may be any solid material known in the art. Non-limiting examples of the template may be non-limiting examples of a printing substrate as will be described later. Preferably, the template may be glass, a silicone wafer, or an adhesive polymer.

The template may be a flat substrate, a roller or a curved substrate. Also, the template may be a patterned substrate, coated with an adhesive material in a predetermined pattern or shape or having depressions or projections.

One of preferred templates is a patterned photoresist (PR)-coated substrate. The PR may be positive or negative PR. For example, PR may be PMMA (Polymethylmethacrylate), PMGI (PolyMethylGlutarimide), DNQ/Novolac or SU-8, as disclosed in U.S. Pat. Nos. 5,492,793, 5,747,622, 5,468,589, 4,491,628, 5,679,495, 6,379,861, 6,329,125, 5,206,317, 6,146,793, 6,165,682, 6,340,734, 6,028,154, 6,042,989, 5,882,844, 5,691,396, 5,731,126, 5,985,524, 6,531,260 and 6,590,010.

The area of the template as used herein is not particularly limited. According to the present invention, a particle arrangement can be perfectly achieved even over a large-scale template.

Depressions (see 101 of FIGS. 4, 6) and projections present on a surface of the template can be formed by direct printing such as lithography, laser beam, or etching; printing using positive or negative PR; laser ablation after coating a sacrificial layer; or inkjet printing.

Pores defined by the depressions or the projections may have a pore size ranging from 1 to 100,000 nm, preferably from 5 to 5,000 nm, more preferably from 5 to 1,000 nm.

Non-limiting examples of the shapes of the depressions and the projections include nanowells, nanodots, nanopillars, nanotrenchs, nanocones, etc. (FIGS. 9(*a*), (*b*), (*c*)).

As used herein, the size of pores defined by depressions or projections refers to a diameter (in case of nanowells and nanopillars), and a bottom diameter (in case of nanocones). The depth/height of a pore may range from 1 nm to 10000 μm. The bottom surface of a pore may be flat, gently sloped or curved.

The cross-sectional shape of depressions and the projections may be a circle; a polygon such as triangle, square, pentagon, hexagon, heptagon, octagon, nonagon, decagon, trapezoid, rhombus, and parallelogram; a complex shape such as oval, half moon, crescent, flower and star; or a geometrical shape such as linear or curved trench (FIGS. 9(*a*), (*b*), (*c*), 18). One of the features of the present invention is that, regardless of the shapes of pores defined by depressions or projections, particles can be inserted in almost all the pores and perfectly arranged (FIGS. 9-12, 20).

The pores defined by depressions or projections may have shapes corresponding to the shapes of predetermined portions of the particles to be inserted in the pores so that the particles are oriented in predetermined directions (FIGS. 4, 6(*b*), 18-20).

By adjusting a pore size and/or a particle size, one particle or two or more particles can be inserted in each pore, and the same number of particles can be inserted in each pore (FIG. 12).

In case of inserting two or more particles in each pore, each pore may have a shape corresponding to an outer shape defined by the two or more particles so that the two or more particles are inserted in each pore, preferably in a desired orientation (FIGS. 6(*a*), (*b*)).

When depressions or projections are directly formed on a template or when depressions or projections are formed on a coating layer disposed on a template, if a template material and a coating layer material are not rigid but are elastic to some degree, even though a maximal size of each pore defined by the depressions or the projections is smaller than the entire maximal size of one or more particles inserted simultaneously in each pore, the particles can be inserted into each pore by physical pressure. In this case, the particles and/or the pores may undergo deformation after the particle insertion (FIGS. 12(d), (e), (f)). That is, according to the present invention, for particle arrangement on a patterned template, particles are directly inserted in pores by a physical pressure. Thus, when using flexible pores, sizes and shapes of the particles have higher tolerance for particle size and shape, as compared to conventional self-assembly methods.

The pores defined by depressions and/or projections formed on a template to receive particles may have one or more sizes and/or shapes (FIGS. 11(a) to (e)). Even when pores with two or more different sizes and/or shapes are formed in a template, the insertion of particles in pores is performed by physical pressure, instead of self-assembly in solvents, thus enabling the insertion of particles in almost all the pores.

Each depression 101 of the template may have two or more another depressions 102 so that the positions and/or orientations of particles in each depression 101 are individually fixed (FIGS. 6(a), (b)). Here, the depressions 102 capable of fixing the positions and/or orientations of the particles may have one or more sizes and/or shapes.

A particle inserted in a pore and another particle inserted in an adjacent pore may be contacted with or separated from each other by adjusting a distance between the pores, thus enabling the close packed or non-close packed arrays of the particles (FIGS. 10, 12(c)).

For example, the shortest diameter of each pore may range from 2 to 1000 nm.

The adjustment of the positions of the pores formed on the template enables an arrangement of particles in any pattern such as the tetragonal or hexagonal close-packed array (FIG. 9(a) to (f)).

<Arrangement of Particles on Template: Step (b)>

In the inventive methods, the physical pressure can be applied by rubbing or pressing against a template. Preferably, a pressurization member is disposed on a template coated with particles in such a way to be parallel to a surface of the template. In this state, when the reciprocating movement of the pressurization member on the template is performed once or more, a physical pressure may be applied to the particles.

Non-limiting examples of the pressurization member include bare hand; rubber-gloved hand; elastic materials such as natural or synthetic rubber plates with various geometrical shapes, plastic plates, or PDMS plates; glass plates; silicone wafers; etc.

The rubbing time is not particularly limited provided that a desired particle monolayer can be formed. Generally, the rubbing may be performed for 10~180 seconds, preferably 30 seconds.

A particle size may range from 1 nm to 100 μm, more preferably from 10 nm to 10 μm.

In the inventive first and second methods, the particles to be placed on the template may be a powder form in the absence of solvents, or a coated, immersed or dispersed form in a solvent (the volume ratio of the solvent to the particles is 0-10 times, preferably 0~3 times). Preferably, the particles may be a dry powder form in the absence of solvents, or a coated or immersed form in a solvent so that, when physical pressure is applied to the particles, the solvent can function as a lubricant. When employing a patterned PR-coated template, the use of a solvent enables to prevent the scratching of the patterned PR by the particles.

Non-limiting examples of the solvent include water, $C_{1-6}$ lower alcohols, etc.

Non-limiting examples of the particles include organic polymers, inorganic polymers, inorganic materials, metal particles, magnetic materials, semiconductors, biomaterials, etc.

Examples of polymer particles include, but are not limited to, polystyrene, polymethylmethacrylate (PMMA), polyacrylate, polyalphamethylstyrene, polybenzylmethacrylate, polyphenylmethacrylate, polydiphenylmethacrylate, polycyclohexylmethacrylate, styrene-acrylonitrile copolymers, styrene-methylmethacrylate copolymers, etc.

Examples of inorganic particles include, but are not limited to, titanium oxide, zinc oxide, cerium oxide, tin oxide, thallium oxide, barium oxide, aluminum oxide, yttrium oxide, zirconium oxide, copper oxide, nickel oxide, silica, etc.

Examples of metal particles include, but are not limited to, gold, silver, copper, platinum, aluminum, zinc, cerium, thallium, barium, yttrium, zirconium, tin, titanium, cadmium, iron, alloys thereof, etc.

Examples of semiconductor particles include, but are not limited to, single element semiconductor (e.g., Si, Ge), compound semiconductor (e.g., AlP, AlAs, AlSb, GaN, GaP, GaAs, GaSb, InP, InAs, InSb), etc.

Another examples of the particles include, but are not limited to, crystalline and non-crystalline, binary and multi-component main group metal and transition metal chalcogenides such as $SiO_2$, $TiO_2$, ITO and $Al_2O_3$; among the chalcogenides, a composite of two or more materials forming core/shell, core/first shell/second shell, or various other structures; a composite of a fluorescent core material and a shell material surrounding the core; a composite of two or more materials forming a layered structure such as onion; fluorescent materials wherein organic, inorganic or organic/inorganic fluorescent molecules are uniformly or non-uniformly distributed in organic or inorganic particles; particles having magnetic, diamagnetic, paramagnetic, ferroelectric, ferrielectric, super-conductive, conductive, semiconductive, or nonconductive property.

Examples of biomaterial particles include, but are not limited to, proteins, peptides, DNAs, RNAs, polysaccharides, oligosaccharides, lipids, cells, and combinations thereof.

The particles may be symmetric, asymmetric, or amorphous. Non-limiting examples of particle shapes include sphere, hemisphere, cube, tetrahedron, pentahedron, hexahedron, rectangular parallelepiped, octahedron, Y-shape, pillar shape, horn-shape, etc.

The particles may be porous or non-porous.

The particles may be particles (e.g., spherical particles) with curved surfaces with no flat facet, as well as particles with flat facets.

The template and the particles may form a hydrogen bond, an ionic bond, a covalent bond, a coordinate covalent bond, or a van der Waals interaction, through the physical pressure. Hydrogen bond and ionic bond are preferred, hydrogen bond is more preferred.

The inventive methods may further include removing residual particles that are not immobilized on the template, using an adhesive member, after step (b) (FIG. 7).

The particles inserted in the pores of the template may form predetermined 1D, 2D, or 3D patterns or shapes. Non-limiting examples of such patterns include 1D patterns such as 1D wires or 1D stripes; 2D patterns such as 2D tetragonal net arrays; and 3D patterns such as crystal lattice structures (FIG. 11). In this case, the particles may form one or more patterns or shapes (FIG. 11(d), (e)).

The particles may form a fcc (100) array, a fcc (111) array, or a combination array on the template (FIG. 11). That is, particles may form the same symmetric array or two or more different symmetric arrays on a single template (FIG. 11(d), (e)).

The dimensions of patterns formed by the particles are not limited, but each of the length, width and height of a pattern may range from 1 mm to 15 cm, preferably from 5 mm to 5 cm, more preferably from 8 mm to 2 cm.

According to the inventive methods, it is possible to easily form the multilayer arrays as well as monolayer arrays of particles. That is, the inventive first and second methods can achieve a monolayer array of particles, and even more, after forming a first monolayer, can achieve further insertion of particles in interstitial spaces defined by adjacent three or more of the particles constituting the first monolayer using a physical pressure to form a second monolayer. When the formation of the second monolayer is performed once or more, two or more-layered particle arrays can be achieved (FIGS. 11(f), 12(a), (b)).

When using a template having thereon a multilayer array of particles, the multilayer array on the template can be transferred to a printing substrate all at once.

In order to form a stacked structure of particle monolayers, an adhesive material such as PEI may be further coated on a template having thereon particle monolayer(s) before applying a physical pressure such as rubbing.

The particles and/or the template may be surface-coated with an adhesive material (FIGS. 1 and 2).

Non-limiting examples of the adhesive material include (i) —$NH_2$ group-containing compounds, (ii) —SH group-containing compounds, (iii) —OH group-containing compounds, (iv) polymer electrolytes, (v) polystyrene, (vi) PR-containing natural or synthetic compounds, etc.

In case of coating an adhesive material on a surface of a template, it is possible to form free-standing particle arrays and patterns, within a short period, by a simple manner including: forming depressions or projections in predetermined arrays and patterns on an adhesive material covering a template (FIG. 10(a), (b)); applying physical pressure to particles so that the particles are inserted in pores defined by the depressions or projections to form predetermined particle arrays or patterns (FIG. 10(c), (d)); and removing the adhesive material (FIG. 10(e), (f)).

Hereinafter, step (c) of the first and second methods of the present invention will be described with reference to FIG. 3.

<Transfer of Particle Array to Printing Substrate: Step (c)>

In step (c), the template having the particle array formed in step (b) is contacted to a printing substrate to transfer the particle array to the printing substrate.

At this time, a predetermined pressure may be applied to the template after the contact so that the particle array on the template is efficiently transferred to the printing substrate.

In order to easily separate and transfer the particle array from the template to the printing substrate, the first and second methods may further include removing an adhesive material (see A of FIG. 5) coated on the template, between steps (b) and (c).

A method for the removal of the adhesive material A is not particularly limited, but a template coated with an adhesive material such as PEI (polyetherimide) may be thermally treated to remove the adhesive material. At this time, the temperature and duration for the thermal treatment of the template are determined according to the kind of an adhesive material used. For PEI, the thermal treatment may be performed at 400 to 600° C., preferably 500° C., for one hour.

The removal of the adhesive material A such as PR on a template may be performed by various methods known in the art. For example, the removal of PR may be performed by immersing a PR-coated template in a peeling solution or shower-injecting a peeling solution on a template. Non-limiting examples of the peeling solution include a strong alkaline solution, dimethylformamide, dimethylacetamide, dimethylsulfoxide, N-methyl-2-pyrrolidone, methanol, etc.

When a template is made of an adhesive material (e.g., PDMS), the printing substrate may have higher affinity or adhesion property to the particles than the template, so that a particle monolayer or multilayer immobilized on the template is easily transferred to the printing substrate.

In order to provide a printing substrate with higher affinity or adhesion property to the particles than a template, a method of coating another adhesive material (hereinafter, referred to simply as ⌈adhesive material A'⌋ for distinguishing it from the above-mentioned adhesive material A) on a surface of the printing substrate may be used. Here, the adhesive material A' that can be used herein may be a hydrogen bonding mediator capable of strongly binding with the particles. For example, the hydrogen bonding mediator may be PEI (polyetherimide), PyC (4-pyridinecarboxylic acid), and PyA (trans-3-(3-pyridyl)-acrylic acid), but the present invention is not limited thereto.

Even in a case where a template that an adhesive material A is removed is contacted to a printing substrate, the printing substrate may be coated with an adhesive material A' before the contact in order to increase the affinity or adhesion property between particles and the printing substrate.

As used herein, the term "affinity or adhesion property" refers to a binding force of a template or a printing substrate to particles.

A material for the printing substrate is not particularly limited provided that the material can be used in the field employing printed particles.

Non-limiting examples of the printing substrate are as follows:

1. Surface hydroxy-containing oxide materials including at least one of metals such as silicon, aluminum, titanium, tin and indium, and non-metallic elements, for example, conductive glasses such as quartz, mica, glass, ITO (indium tin oxide) glass (ITO-deposited glass), or tin oxide ($SnO_2$), fused silica, amorphous silica, porous silica, alumina, porous alumina, crystallized quartz, sapphire, titanium dioxide, porous titanium dioxide, silicone wafer, etc.;

2. Thiol (—SH) or amine (—$NH_2$) group-bondable metals such as gold, silver, copper, and platinum, and metals such as nickel and stainless steel;

3. Variously functionalized polymers, e.g., surface-functionalized polyvinylchloride (PVC), Merrifield peptide resin, polystyrene, polyester, polydimethylsiloxane (PDMS), (+) or (−) PR (photoresist), PMMA (poly(methyl methacrylate)) and acrylics;

4. Semiconductors such as zinc selenide (ZnSe), gallium arsenide (GaAs), and indium phosphide (InP);

5. Natural or synthetic zeolites and their pseudo porous molecular sieves; and

6. Surface hydroxy-containing natural, synthetic or conductive polymers such as cellulose, starch (amylase and amylopectin), and lignin.

Through repetition (twice or more) of steps (a), (b) and (c), it is possible to form a two or more-layered (multilayer) array of particles on a printing substrate.

In case of printing a particle multilayer array on a printing substrate, particles constituting adjacent two layers may be the same or different. Also, when forming two or more-layered arrays of particles, patterns of adjacent two layers may be the same or different.

In case of using two or more different templates, it is possible to form a printed matter wherein particles are arranged into different patterns or shapes.

In case of using a single-patterned template and different particles made of different materials, it is possible to form a printed matter wherein the kind of particles is different in every pattern.

<Preparation of Printed Matter with Particle Array>

According to the above-described inventive methods, it is possible to prepare printed matters with variously structured particle arrays (e.g., 1D, 2D or 3D close packed or non-close packed arrays).

In a printed matter including an array of particles on a printing substrate, manufactured by any one of the above-described inventive methods, a transparent or opaque protecting material may be further coated/filled on surfaces of the particles or in spaces defined by the particles.

Non-limiting examples of the protecting material include PDMS, thermoplastic polymers, conductive polymers, plastics, Nafion, cellulose, meltable metals, silica precursors, titanium dioxide precursors, metal oxide precursors, metal sulfide precursors, etc.

The inventive printed matter including a printed array of particles on a substrate can be stabilized by coating a natural or synthetic polymer such as a silicon-containing compound, a titanium-containing compound, Nafion, polystyrene, an acrylic resin, and polyalcohol.

<Application of the Inventive Methods>

According to the inventive methods, it is possible to prepare a printed matter including an n-layered array of particles (here, n is a natural number of 2 or more) wherein, in adjacent two layers, e.g., a k layer and a k+1 layer (herein, 0<k<n, k is a natural number), particles of the k+1 layer can be vertically arranged on particles of the k layer (FIGS. 16, 17).

Here, removable polymer particles may be inserted in spaces defined by the particles constituting the k layer and the k+1 layer that are adjacent to each other (FIG. 16(c)).

For example, polymer particles are placed on a template with pores capable of fixing the positions of the polymer particles and inserted into the pores by physical pressure such as rubbing to form a polymer particle monolayer array; first particles are inserted into pores defined by the polymer particles constituting the polymer particle monolayer array, by physical pressure such as rubbing, to form a first particle layer; the polymer particle monolayer array and the first particle layer stacked on the template are transferred to a printing substrate; second particles are inserted into pores (spaces) defined by the first particles constituting the first particle layer and the polymer particles constituting the polymer particle monolayer array on the printing substrate, by physical pressure such as rubbing, to form a second particle layer; and the polymer particles were removed by calcination, to thereby form a snowman-like layered array that the second particles are stacked on the first particles.

Here, the dimensions/shapes/materials of the first and second particles may be the same or different.

While the present invention has been particularly shown and described with reference to exemplary embodiments thereof, it will be understood by those of ordinary skill in the art that various changes in form and details may be made therein without departing from the spirit and scope of the present invention as defined by the following claims.

Effect of the Invention

According to the inventive methods, a printed matter including a printed array of particles is prepared by arranging particles on a patterned template by physical pressure to exclude the self-assembly of the particles and transferring the particle array to a printing substrate, thereby enabling accurate and simple production of a printed matter including a printed array of particles with high particle arrangement and/or density.

Furthermore, when a particle array on a template is transferred to a printing substrate, the use of a solvent is not required. Thus, it is not necessary to perform a solvent removal process required in a conventional wet process for particle arrangement, thereby enabling convenient and simple printing of particles on a printing substrate.

In addition, a printed matter including a printed array of particles on a substrate can be mass-produced in a short time, and monolayer or multilayer arrays of particles can be achieved on a large-scale substrate. Also, printed matters including various arrays of particles on substrates can be produced with the same high quality (good reproducibility).

(panel (e)) and fcc (100) (panel (f)) arrays of 700 nm sized silica beads. The panel (g) is a 2D fcc (100) array of 700 nm sized silica beads and the panel (h) is a 2D fcc (111) array of 700 nm sized silica beads [panels (a) to (f); 20K magnification, panels (g) to (j); 8K magnification].

Figure 1:
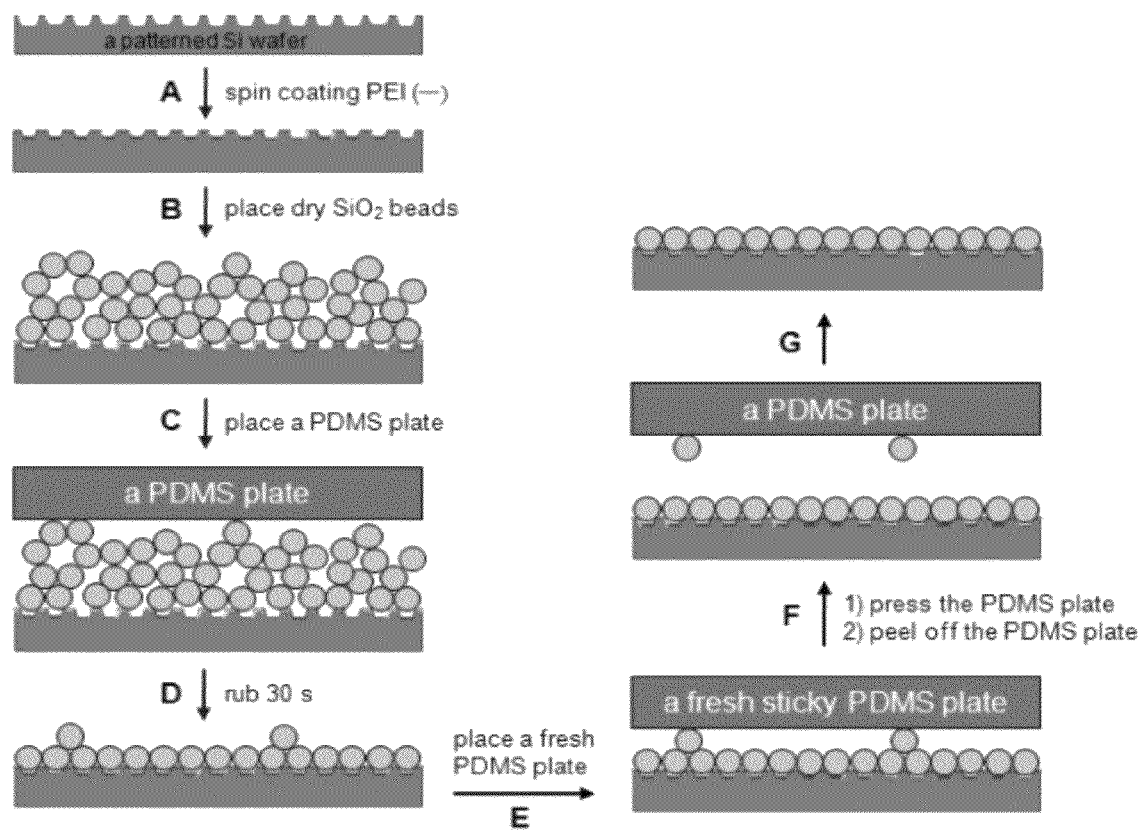
FIG. 1 is a flow diagram illustrating an embodiment of steps (a) and (b) of the first method of the present invention.
Figure 2:
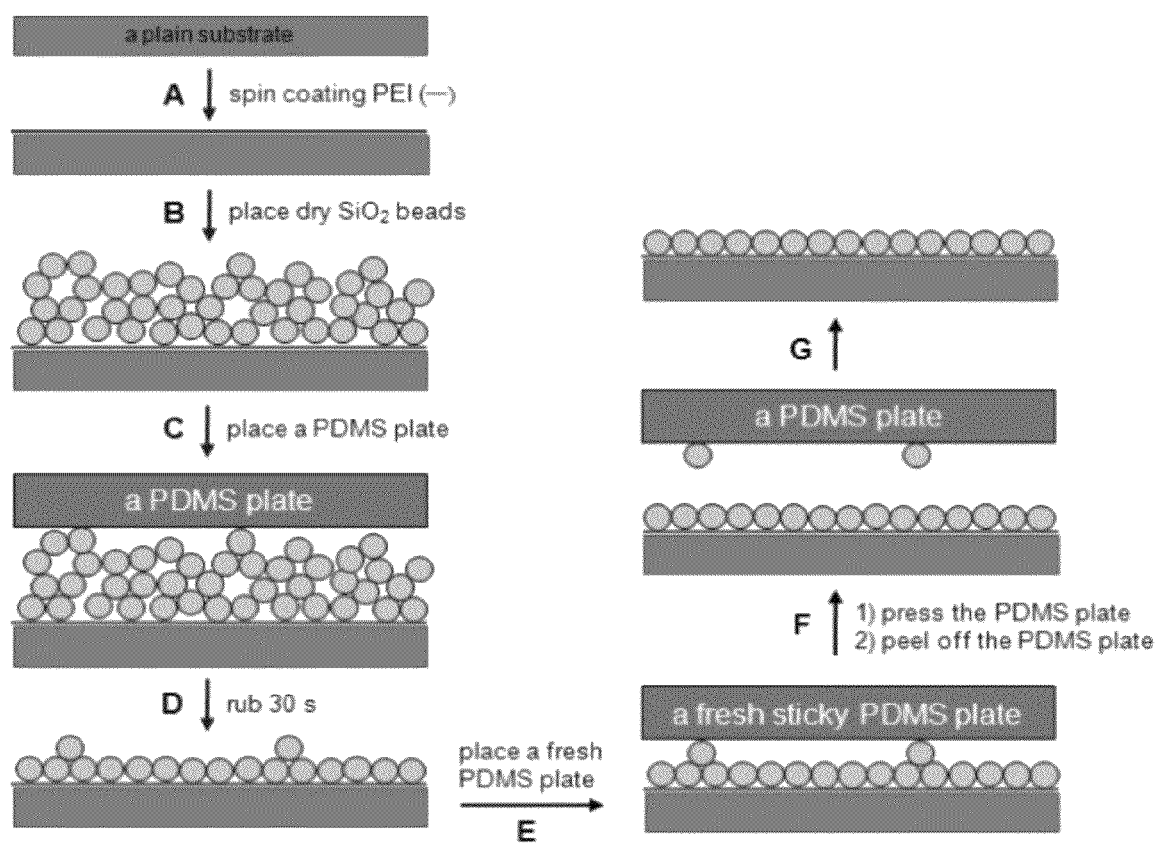
FIG. 2 is a flow diagram illustrating an embodiment of steps (a) and (b) of the second method of the present invention.
Figure 3:
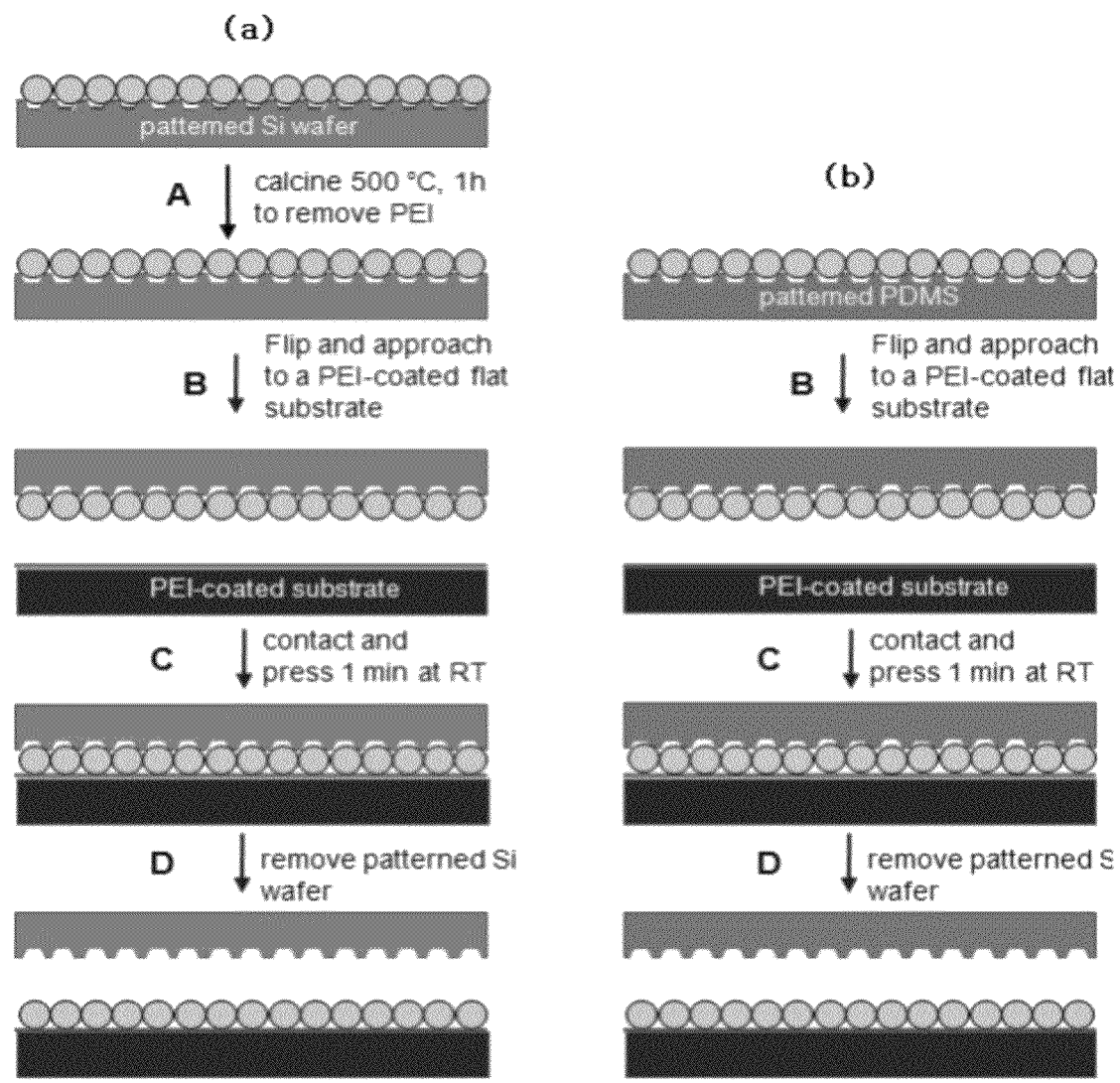
FIG. 3 is a flow diagram illustrating an embodiment of step (c) according to the inventive methods.
Figure 4:
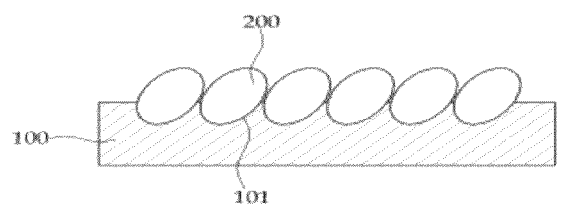
FIG. 4 is a diagram illustrating the insertion and arrangement of particles 200 in a predetermined orientation in patterned depressions 101 of a template 100.
Figure 5:
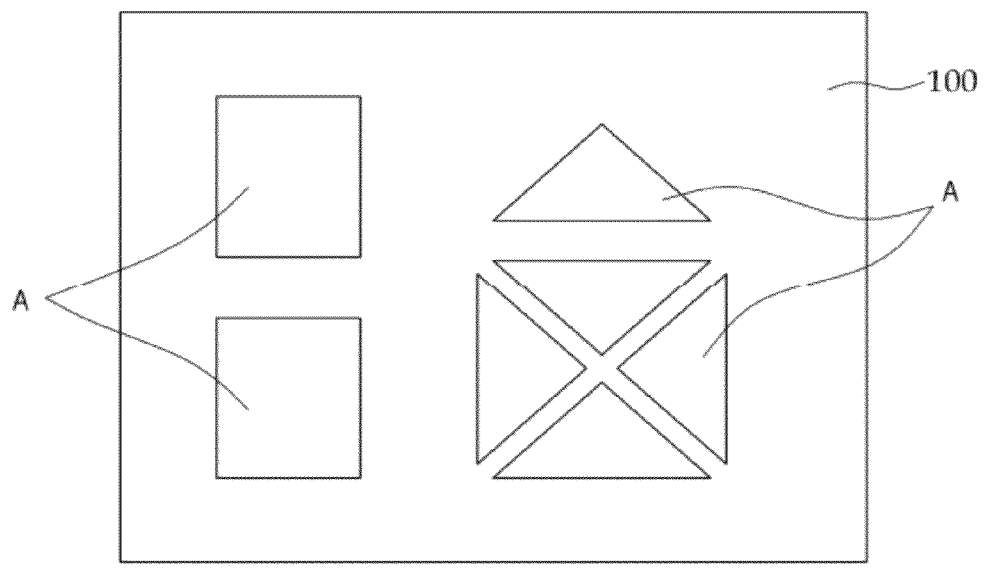
FIG. 5 is a diagram illustrating a substrate 100 with adhesive surface portions patterned or shaped with an adhesive material A.
Figure 6:
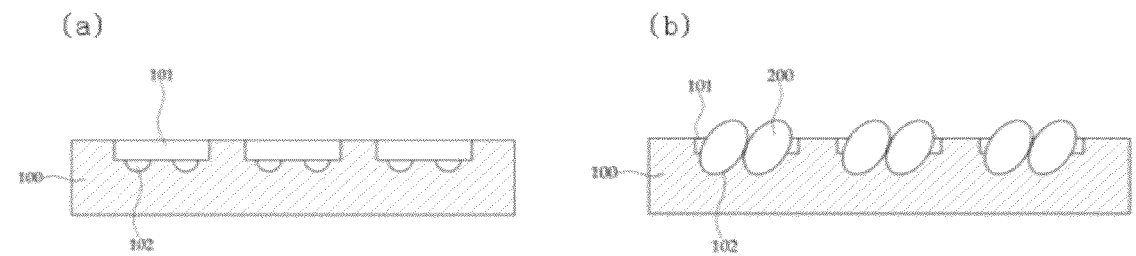
FIG. 6(a) is a diagram illustrating first depressions 101 and second depressions 102 patterned on a template 100.
FIG. 6(b) is a diagram illustrating the arrangement of particles 200 in first and second depressions 101 and 102 patterned on a template 100.
Figure 7:
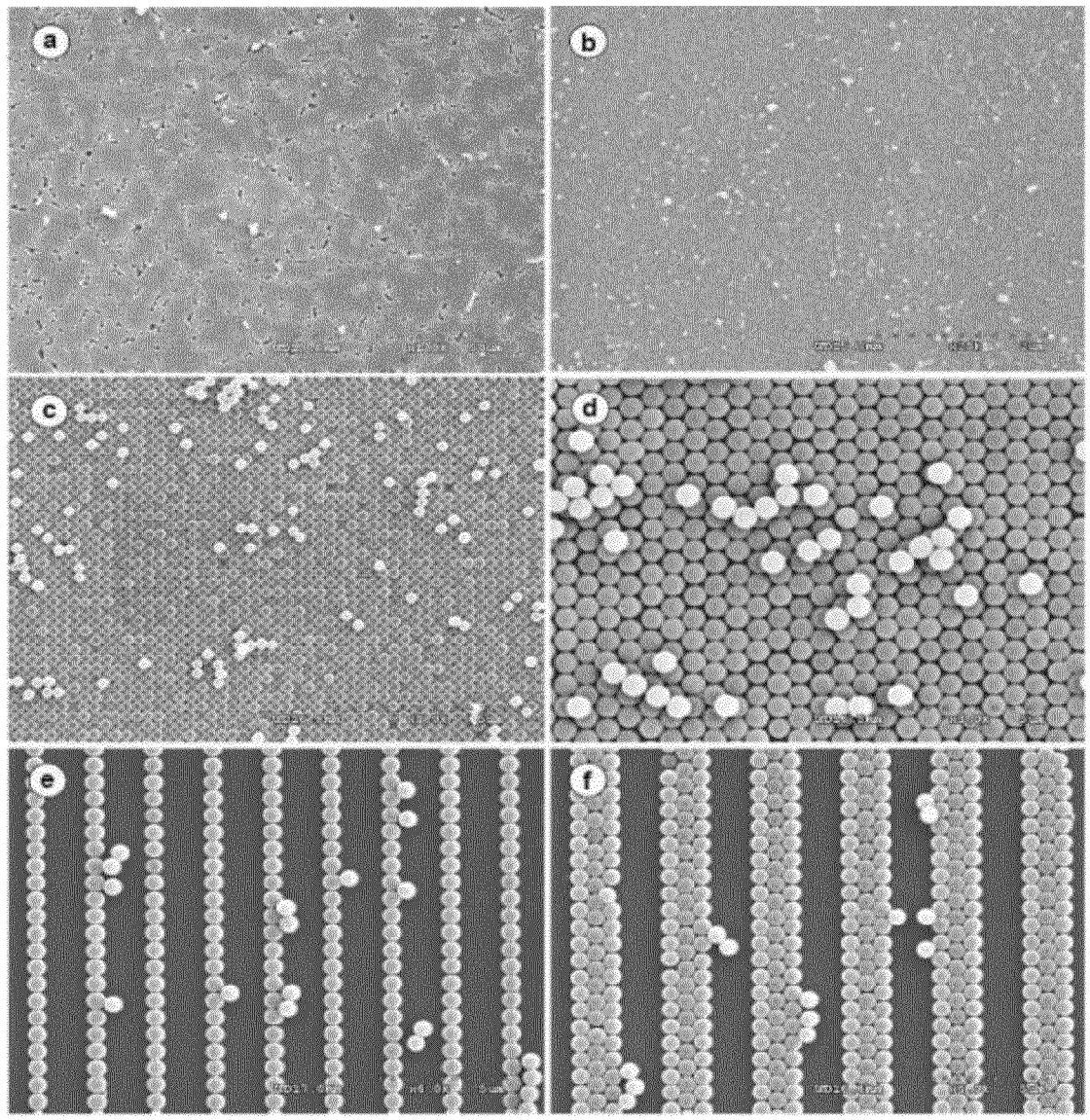
FIG. 7 is scanning electron microscopic (SEM) images showing undesired silica beads randomly attached onto 1D or 2D arrays of silica beads formed on PEI-coated glass plates by rubbing (panel (a): a 2D monolayer array of 1 μm sized silica beads (1K magnification); panel (b): a 2D monolayer array of 20 nm sized silica beads (20K magnification); panel (c): a fcc (100) array of 300 nm sized silica beads (8K magnification); panel (d): a fcc (100) array of 700 nm sized silica beads (8K magnification); panel (e): a 1D wire parallel array of 700 nm sized silica beads (6K magnification); and panel (f): a 1D stripe parallel array of 700 nm sized silica beads (6K magnification).
Figure 8:
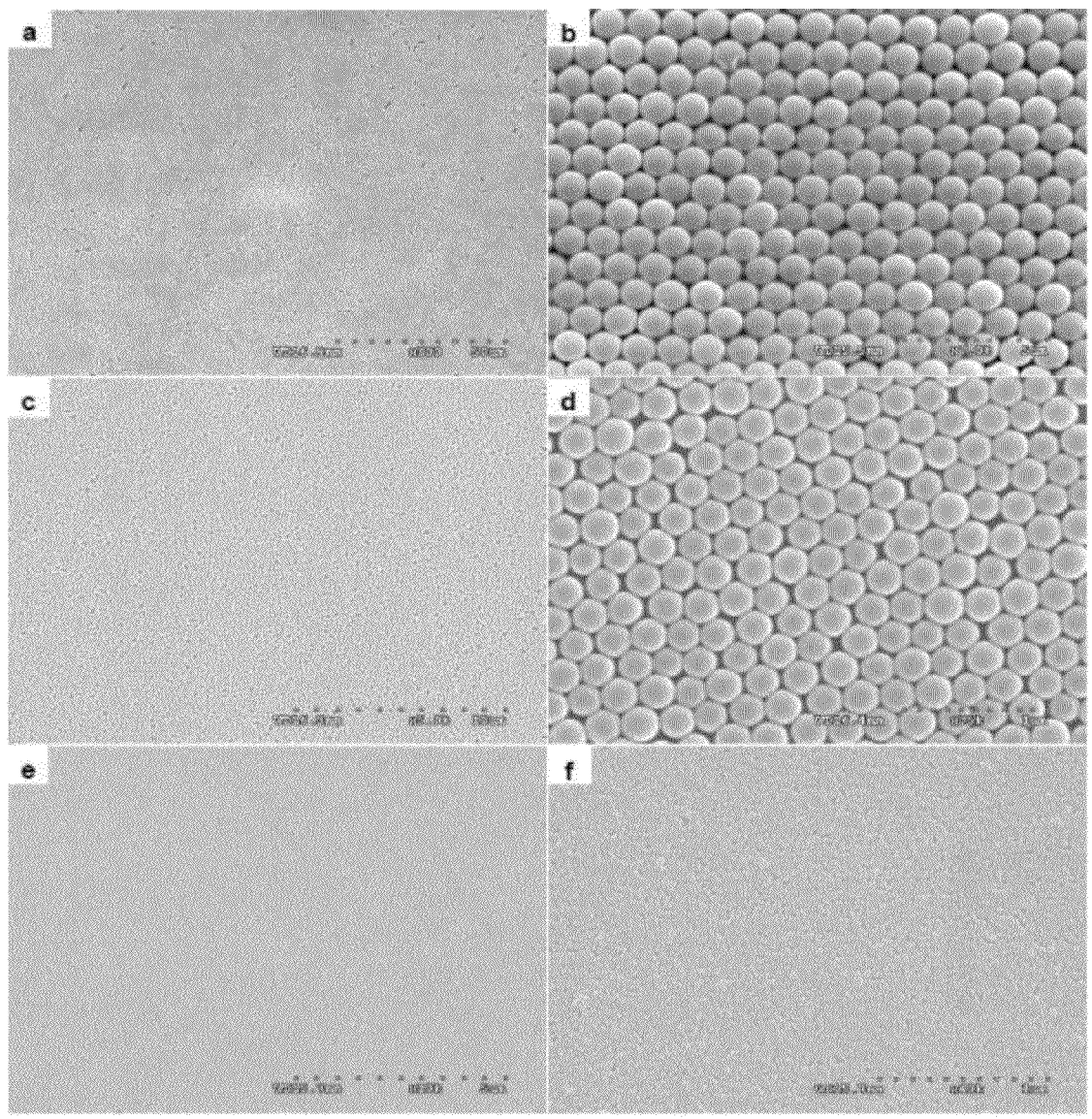
FIG. 8 is SEM images showing monolayer arrays of silica beads formed on PEI-coated flat glass plates by rubbing (panel (a): 1 μm sized silica beads under 0.8K magnification; panel (b): 1 μm sized silica beads under 7K magnification; panel (c): 200 nm sized silica beads under 5K magnification; panel (d): 200 nm sized silica beads under 35K magnification; panel (e): 20 nm sized silica beads under 10K magnification; panel (f): 20 nm sized silica beads under 40K magnification).
Figure 9:
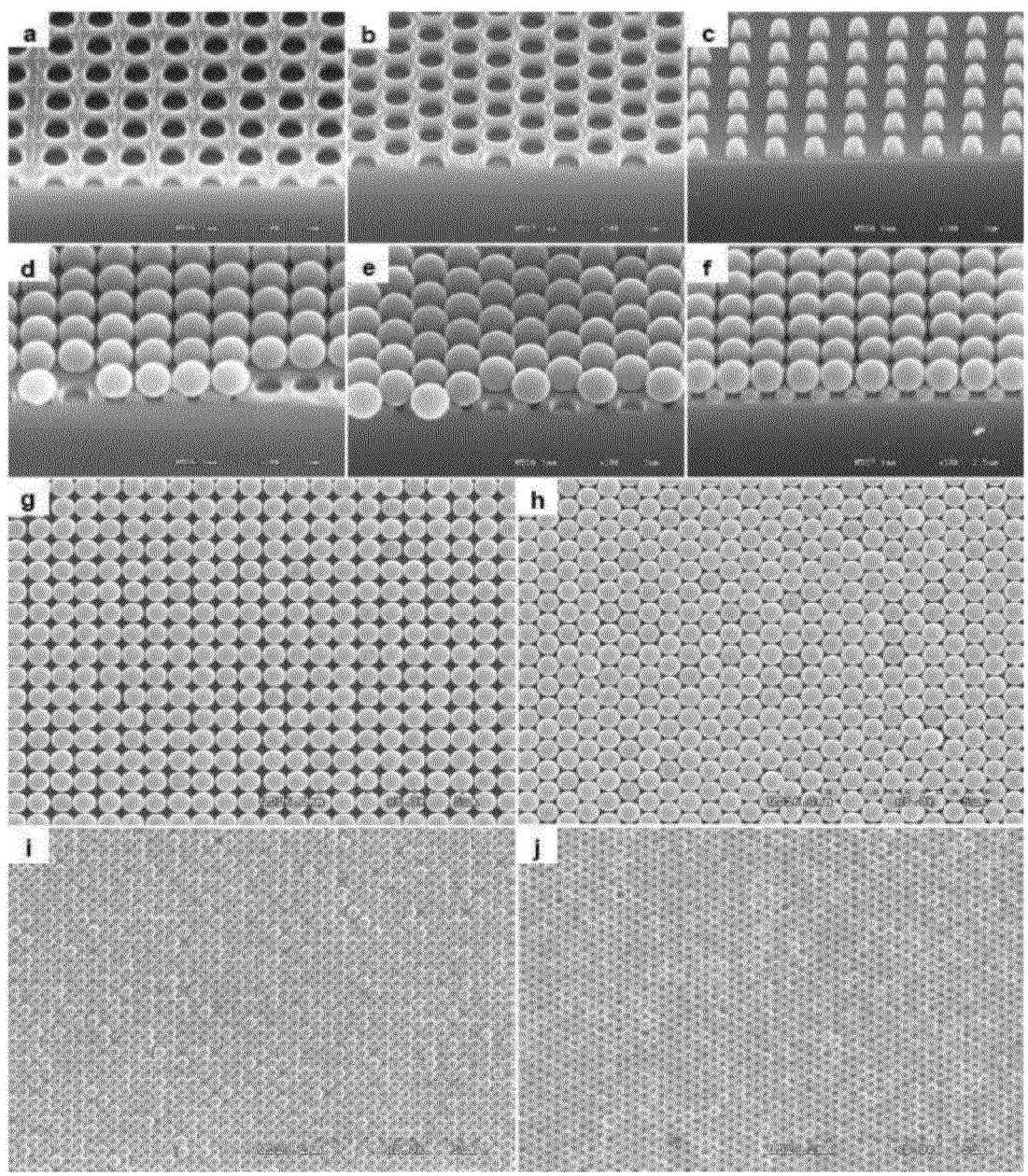
FIG. 9(a), (b), and (c) are SEM images showing silicone wafers patterned with nano-sized 2D arrays (panel (a): a tetragonal well array with 500 nm in diameter, 250 nm in depth and 700 nm in pitch; panel (b): a hexagonal well array with 250 nm in depth and 200 nm in top diameter; panel (c): a 2D array of truncated cones with 250 nm in bottom diameter). The arrays of the panels (a), (b) and (c) were respectively used as templates for 2D fcc (100) (panel (d)), fcc (111)
Figure 10:
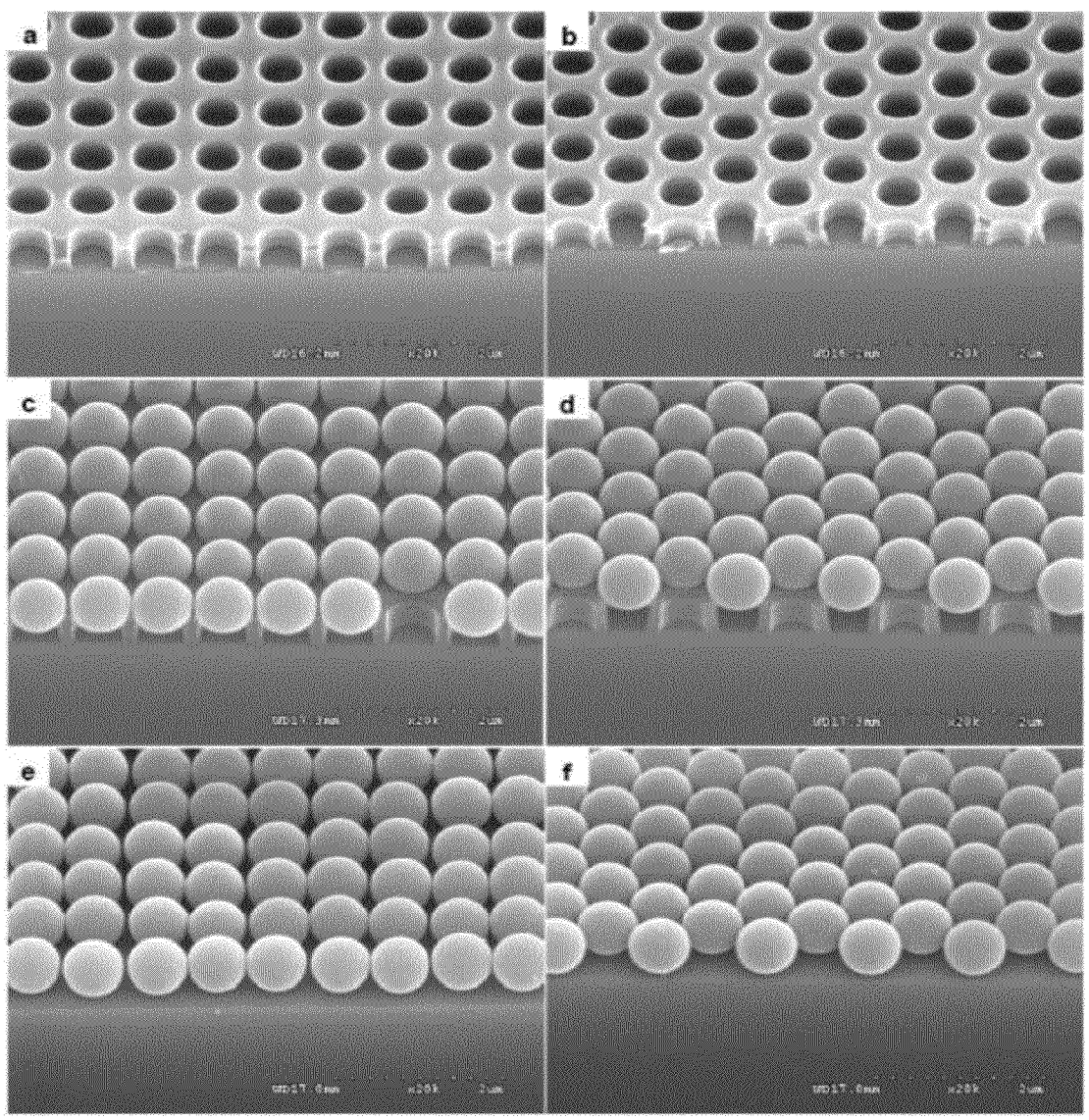

FIGS. 10(a) and (b) are SEM images showing silicone wafers coated with PR films of 350 nm in thickness that were patterned with wells of 500 nm in diameter and 700 nm in pitch to form a tetragonal net array (panel (a)) and a hexagonal net array (panel (b)). Panels (c) and (d) are SEM images showing 2D arrays of 700 nm sized silica beads on the silicone wafers of the panels (a) and (b), respectively. Panels (e) and (f) are SEM images showing free-standing, 2D fcc (100) and fcc (111) monolayer arrays, respectively, of 700 nm sized silica beads on flat silicone wafers after PR removal.

Figure 11:
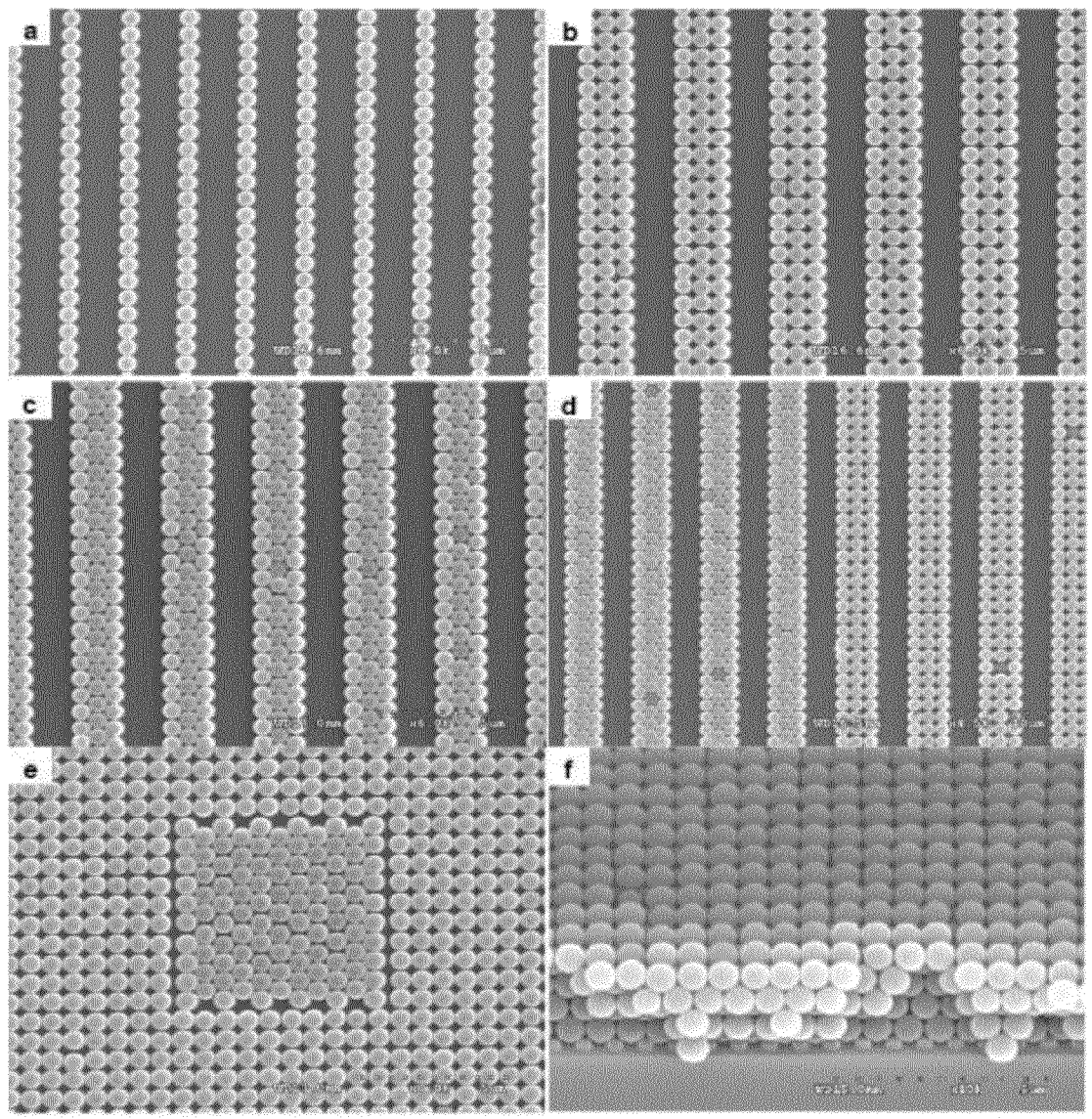

FIG. 11 is SEM images showing 1D, 2D and 3D close-packed arrays of 700 nm sized silica beads on patterned silicone wafers (panel (a): 1D wires; panel (b): 1D fcc (100) stripes; panel (c): 1D fcc (111) stripes; panel (d): a mixed 1D pattern of fcc (100) stripes and fcc (111) stripes; panel (e): a mixed 2D pattern of fcc (100) and fcc (111) arrays; and panel (f): a 3D fcc (100) array formed by a layer-by-layer pattern (five layers).

Figure 12:
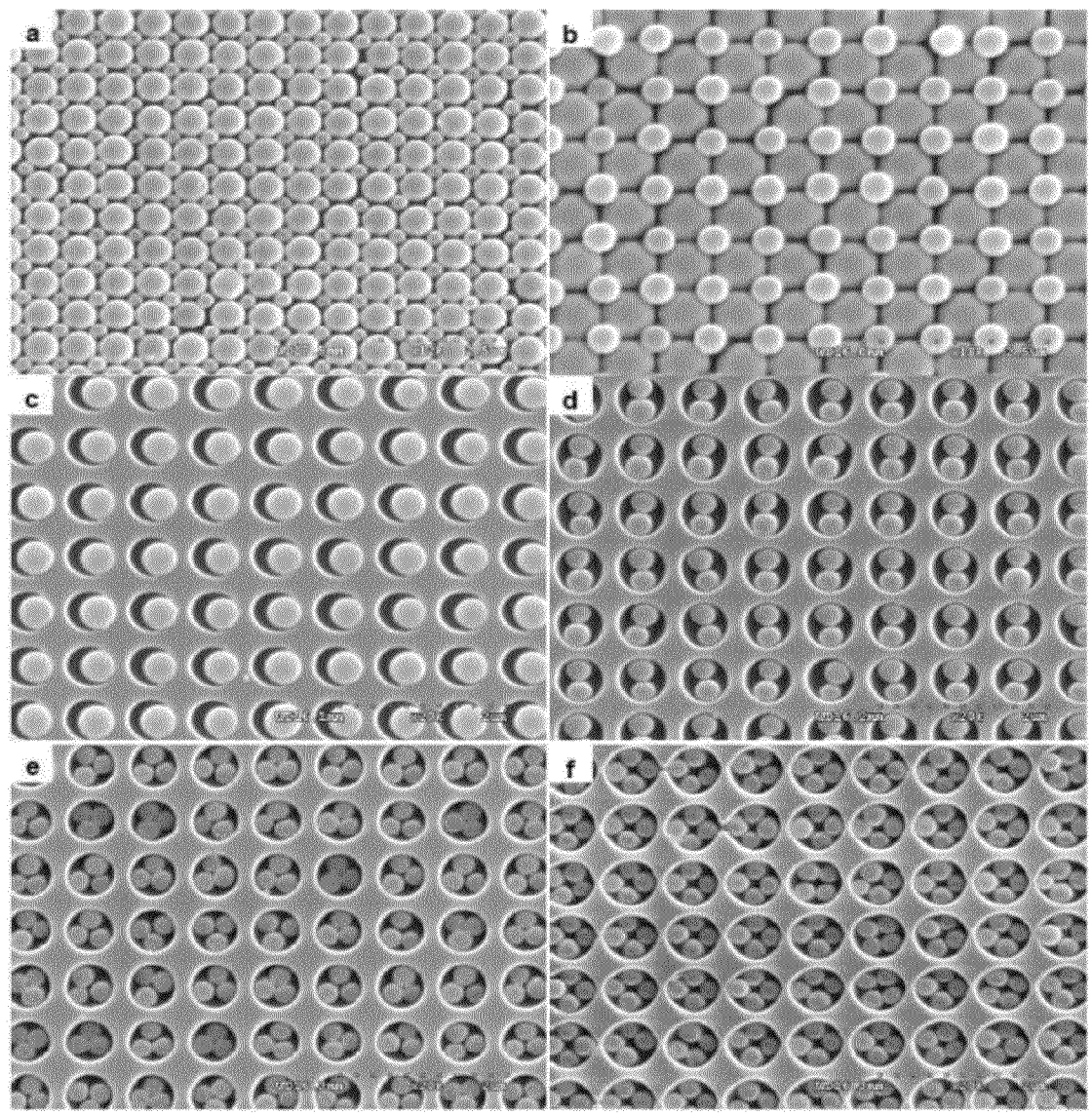

FIG. 12 is SEM images showing binary 2D arrays of 700 nm and 300 nm sized silica beads (panel (a)) and 700 nm and 420 nm sized silica beads (panel (b)); a non-close packed 2D array of 420 nm sized silica beads (panel (c)); a non-close packed 2D array formed by inserting two 300-nm sized silica beads in each pore (panel (d)), a non-close packed 2D array formed by inserting three 250-nm sized silica beads in each pore (panel (e)); and a non-close packed 2D array formed by inserting four 230-nm sized silica beads in each pore (panel (f)). Here, silicone wafers patterned with tetragonal net arrays of nanowells (500 nm in diameter, 250 nm in depth, 700 nm in pitch) were used.

FIG. 13 is SEM images showing resultant structures formed by transferring close-packed, tetragonal and hexagonal net arrays of 700 nm sized silica beads on silicone wafers to PEI-coated glass substrates.

FIG. 14 is SEM images showing resultant structures formed by transferring non-close packed, tetragonal and hexagonal net arrays of 600 nm sized silica beads on silicone wafers to PEI-coated glass substrates.

Figure 15:
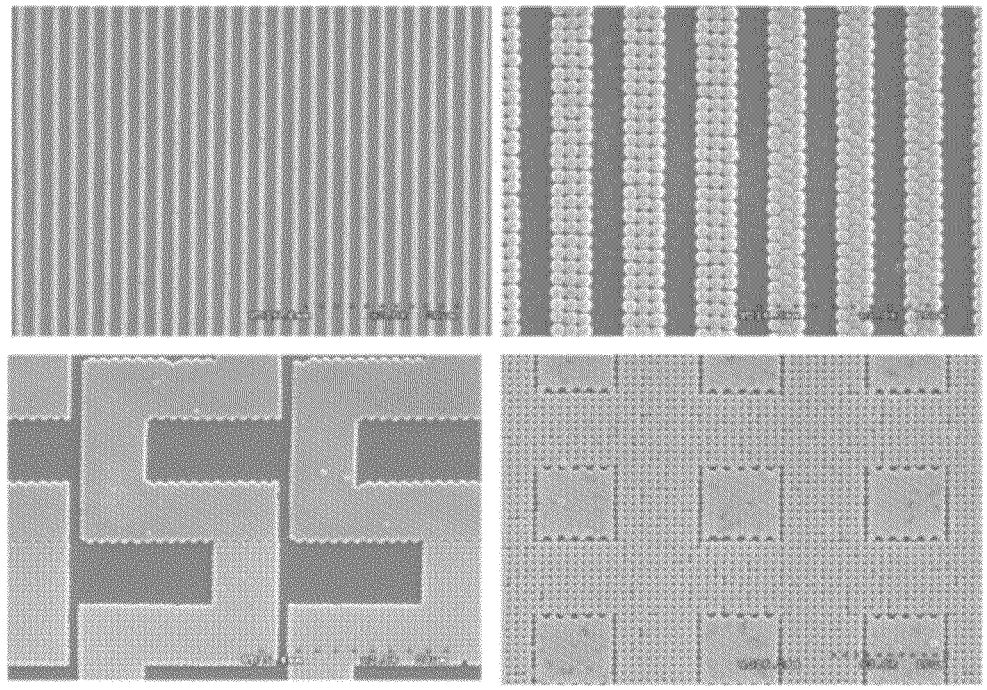

FIG. 15 is SEM images showing resultant structures formed by transferring 1D or 2D close-packed arrays of silica beads on patterned silicone wafers to PEI-coated glass substrates.

Figure 16:
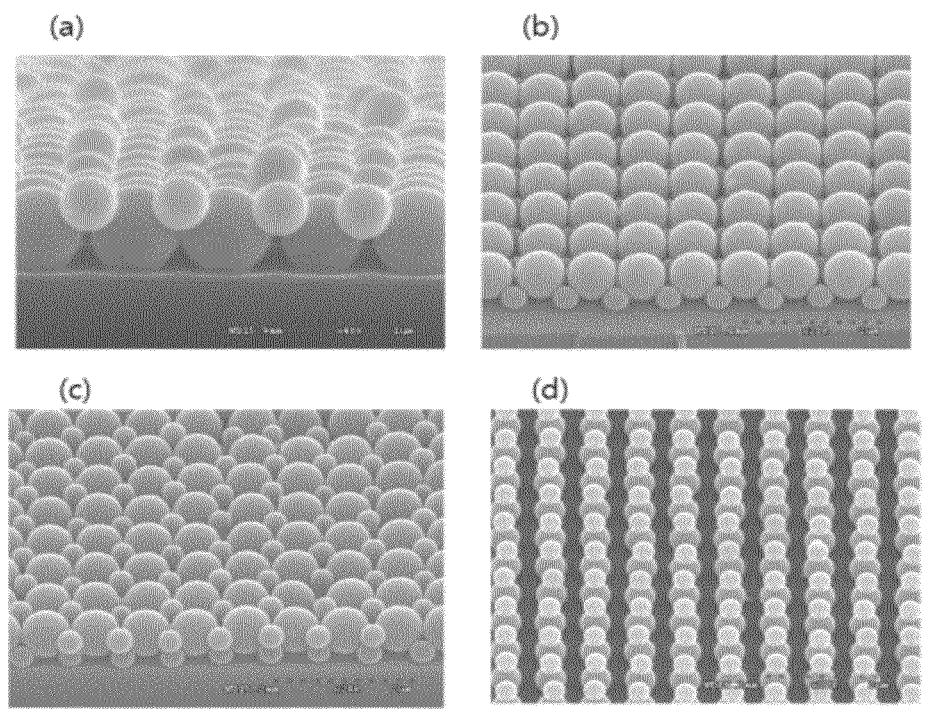

FIG. 16(a), (b), (c) and (d) are SEM images showing a process of preparing a snowman-like layered array of silica beads. Panel (a) is a SEM image showing a resultant structure formed by inserting 700 nm sized PMMA polymer particles into pores defined by a tetragonal net array formed on a PDMS template by rubbing to form a tetragonal non-close packed monolayer array of the polymer particles and inserting 200 nm sized silica beads into pores defined by the polymer particles by rubbing to form a first silica bead layer; panel (b) is a SEM image showing a resultant structure formed by transferring the PMMA polymer layer and the first silica bead layer on the template of panel (a) to a PEI-coated glass substrate; panel (c) is a SEM image showing a resultant structure formed by inserting 200 nm sized silica beads into pores defined by the PMMA polymer particle layer and the first silica bead layer of panel (b) by rubbing to form a second silica bead layer; and panel (d) is a SEM image showing a non-close packed, tetragonal net, snowman-like layered array formed by removing the PMMA polymer particles by calcination from the stacked structure of panel (c) including the first layer made of 200 nm sized silica beads, the polymer layer made of 700 nm PMMA polymer particles and the second layer made of 200 nm silica beads on the PEI-coated glass substrate.

Figure 17:
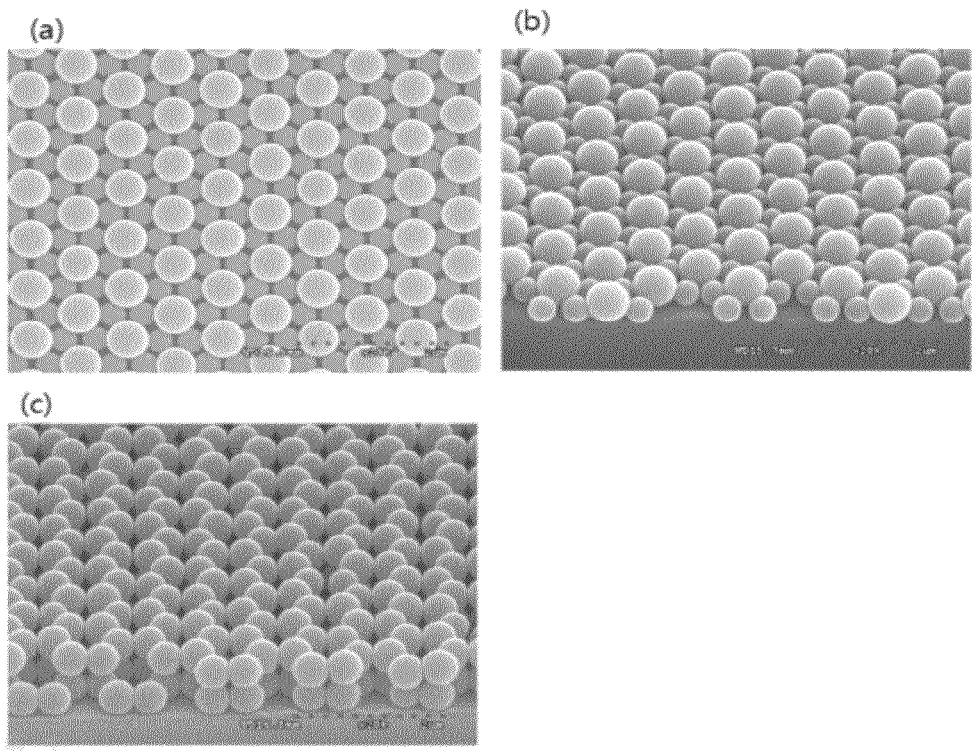

FIGS. 17(a) and (b) are SEM images showing resultant structures formed by transferring a hexagonal non-close packed array of a PMMA polymer particle (700 nm) layer and a first silica bead (200 nm) layer on a patterned PDMS template to a PEI-coated glass substrate (panel (a): top view; panel (b): tilted view), and FIG. 17(c) is a SEM image showing a hexagonal non-close packed, snowman-like layered array formed by stacking a second silica bead (200 nm) layer as a hexagonal non-close packed array on the resultant structure of panel (b) and removing the PMMA polymer particles by calcination.

Figure 18:
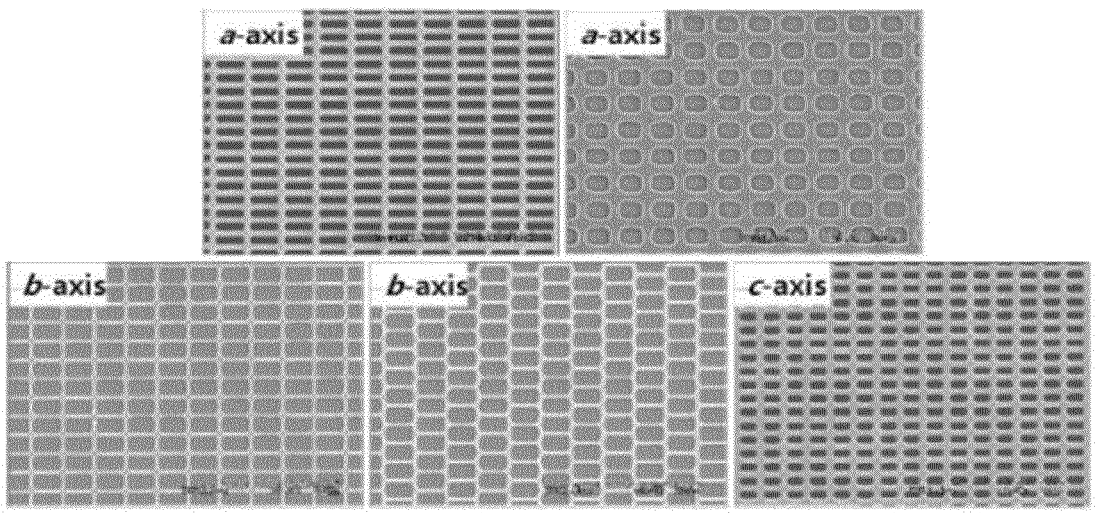

FIG. 18 is SEM images showing silicone wafers negatively patterned with PR in order to receive crystalline silica particles with a-, b- and c-axes in corresponding axis directions.

FIG. 19 is SEM images showing anisotropic, coffin shape silicalite-1 crystals and anisotropic leaf shape silicalite-1 crystals; and crystal axes thereof.

Figure 20:
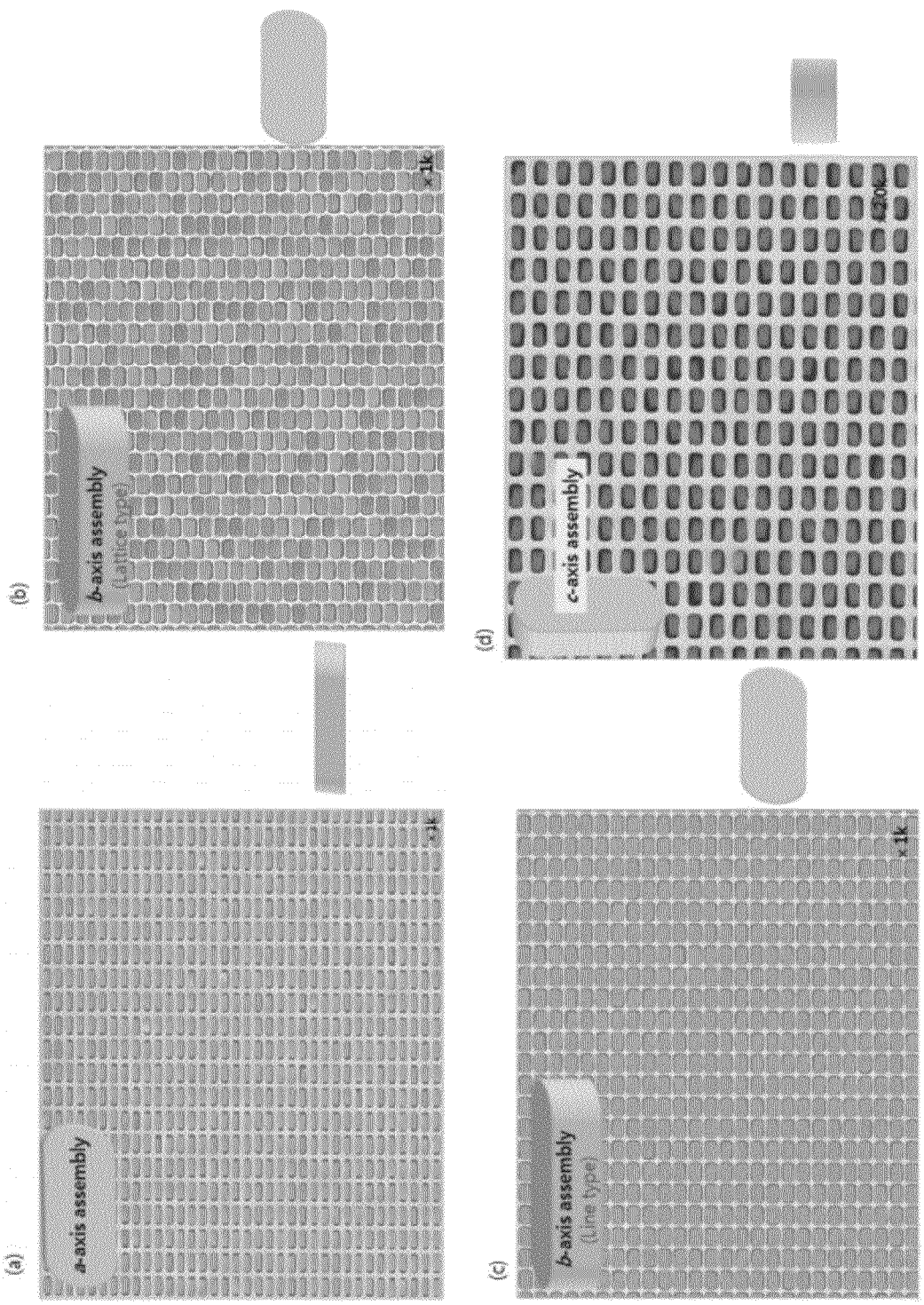

FIGS. 20(a), (b), (c) and (d) are SEM images showing a-, b- and c-axis assemblies of crystalline silica particles with a-, b- and c-axes inserted in silicone wafers negatively patterned with PR as shown in FIG. 18.

FIG. 21 is SEM images showing the arrays of crystalline silica particles with a-, b- and c-axes inserted in silicone wafers negatively patterned with PR, left after PR removal by calcinations.

FIG. 22 is SEM images showing the resultant printed matters obtained by transferring the arrays of crystalline silica particles with a-, b- and c-axes inserted in silicone wafers negatively patterned with PR, left after PR removal by calcination, to PEI-coated glass plates.

DESCRIPTION OF REFERENCE NUMERALS

100: template,
101: first depression
102: second depression,
200: particle,
A: adhesive material

What is claimed is:
1. A method of preparing a printed matter with a printed array of particles, the method comprising:
(a) preparing a template, a surface of which has depressions or projections capable of fixing the positions and/or orientations of one or more particles;
(b) placing the particles on the template and applying a physical pressure to the particles so that a portion or the whole of each particle is inserted in each of pores defined by the depressions or the projections to form a particle array; and
(c) contacting the template having thereon the particle array to a printing substrate so that the particle array is transferred to the printing substrate; or
the method comprising:
(a) preparing a template, at least a surface portion of which has adhesive property;
(b) placing particles on the template and applying a physical pressure to the particles so that the particles are immobilized on adhesive surface portions of the substrate to form a particle array; and
(c) contacting the template having thereon the particle array to a printing substrate so that the particle array is transferred to the printing substrate;

wherein the methods further comprise removing particles randomly placed on the particle array of step (b) using an adhesive member.

2. The method of claim 1, wherein the physical pressure is applied by rubbing or pressing against the template.

3. The method of claim 1, wherein the depressions and the projections are formed by direct printing, printing using photoresist, laser ablation after sacrificial layer coating, or inkjet printing.

4. The method of claim 1, wherein the particles to be placed on the template are a powder form in the absence of solvents, or a coated, immersed or dispersed form in a solvent of a 0-10 times volume of the particles.

5. The method of claim 1, wherein the pores have shapes corresponding to the shapes of predetermined portions of the particles to be inserted in the pores so that the particles are oriented in predetermined directions.

6. The method of claim 1, wherein the shapes of the depressions and the projections are nanowells, nanodots, nanopillars, nanotrenches or nanocones.

7. The method of claim 1, wherein the pores receiving the particles have two or more different sizes and/or shapes.

8. The method of claim 1, wherein each of the depressions of the substrate comprises two or more another depressions capable of individually fixing the positions and/or orientations of the particles therein.

9. The method of claim 1, wherein the particles inserted in the pores of the template form a predetermined pattern or shape, or the adhesive surface portions of the template form a predetermined pattern or shape so that the particles immobilized on the adhesive surface portions of the template form a pattern or shape corresponding to the predetermined pattern or shape of the adhesive surface portions.

10. The method of claim 1, wherein a particle inserted in a pore and another particle inserted in an adjacent pore are contacted with or separated from each other by adjusting a distance between the pores.

11. The method of claim 1, wherein two or more different templates are used so that the particles arranged on the template form different patterns or shapes and/or have different particle sizes and/or orientations.

12. The method of claim 1, further comprising: (i) placing particles on the resultant monolayer formed after step (b) and applying a physical pressure to the particles so that the particles are inserted into interstitial spaces defined by adjacent three or more of the particles constituting the monolayer, wherein step (i) is performed once or more to form a two or more-layered array of particles on the template.

13. The method of claim 1, wherein steps (a), (b) and (c) are repeated twice or more to form a two or more-layered array of particles on the printing substrate.

14. The method of claim 1, wherein the particles and/or the template and/or the printing substrate are surface-coated with an adhesive material.

15. The method of claim 14, further comprising: removing the adhesive material coated on the particles and/or the template, between steps (b) and (c).

16. A method of preparing a printed matter with a printed array of particles, the method comprising:
(a) preparing a template, a surface of which has depressions or projections capable of fixing the positions and/or orientations of one or more particles;
(b) placing the particles on the template and applying a physical pressure to the particles so that a portion or the whole of each particle is inserted in each of pores defined by the depressions or the projections to form a particle array; and
(c) contacting the template having thereon the particle array to a printing substrate so that the particle array is transferred to the printing substrate; or
the method comprising:
(a) preparing a template, at least a surface portion of which has adhesive property;
(b) placing particles on the template and applying a physical pressure to the particles so that the particles are immobilized on adhesive surface portions of the substrate to form a particle array; and
(c) contacting the template having thereon the particle array to a printing substrate so that the particle array is transferred to the printing substrate;
wherein the shapes of the depressions and the projections are nanowells,
nanodots, nanopillars, nanotrenches or nanocones.

17. A method of preparing a printed matter with a printed array of particles, the method comprising:
(a) preparing a template, a surface of which has depressions or projections capable of fixing the positions and/or orientations of one or more particles;
(b) placing the particles on the template and applying a physical pressure to the particles so that a portion or the whole of each particle is inserted in each of pores defined by the depressions or the projections to form a particle array; and
(c) contacting the template having thereon the particle array to a printing substrate so that the particle array is transferred to the printing substrate; or
the method comprising:
(a) preparing a template, at least a surface portion of which has adhesive property;
(b) placing particles on the template and applying a physical pressure to the particles so that the particles are immobilized on adhesive surface portions of the substrate to form a particle array; and
(c) contacting the template having thereon the particle array to a printing substrate so that the particle array is transferred to the printing substrate;
wherein the particles and/or the template and/or the printing substrate are surface-coated with an adhesive material, and the methods further comprise removing the adhesive material coated on the particles and/or the template, between steps (b) and (c).

* * * * *